US011734477B2

(12) United States Patent
Punako, Jr. et al.

(10) Patent No.: US 11,734,477 B2
(45) Date of Patent: Aug. 22, 2023

(54) LOCATION-BASED VR TOPOLOGICAL EXTRUSION APPARATUS

(71) Applicant: Concurrent Technologies Corporation, Johnstown, PA (US)

(72) Inventors: Ronald Punako, Jr., Johnstown, PA (US); David Ray Hockenberry, Friedens, PA (US); John Lee Wass, III, Addison, PA (US); Jeremy Adam Brougher, Johnstown, PA (US); James David Luciew, Johnstown, PA (US)

(73) Assignee: Concurrent Technologies Corporation, Johnstown, PA (US)

( * ) Notice: Subject to any disclaimer, the term of this patent is extended or adjusted under 35 U.S.C. 154(b) by 587 days.

(21) Appl. No.: 16/296,931

(22) Filed: Mar. 8, 2019

(65) Prior Publication Data

US 2019/0278882 A1 Sep. 12, 2019

Related U.S. Application Data

(60) Provisional application No. 62/640,241, filed on Mar. 8, 2018.

(51) Int. Cl.
*G06F 30/23* (2020.01)
*G06T 15/08* (2011.01)
(Continued)

(52) U.S. Cl.
CPC ............ *G06F 30/23* (2020.01); *E04B 1/3511* (2013.01); *E04G 21/167* (2013.01); *G06F 30/10* (2020.01);
(Continued)

(58) Field of Classification Search
CPC .......... G06F 30/23; G06F 30/10; G06F 3/016; E04B 1/3511; E04G 21/167; G06T 15/08;
(Continued)

(56) References Cited

U.S. PATENT DOCUMENTS 4,371,345 A * 2/1983 Palmer ................... G02B 30/52
D11/131
5,038,302 A * 8/1991 Kaufman .............. G06T 17/005
345/441
(Continued)

OTHER PUBLICATIONS

Hiroshi Ishii et al., "Transform", Tangible Media Group, MIT Media Lab—2014 printed from http://tangible.media.mit.edu/project/transform/, accessed on Jun. 4, 2020 (4 pp.).
(Continued)

*Primary Examiner* — Charles L Beard
(74) *Attorney, Agent, or Firm* — Buchanan Ingersoll & Rooney PC

(57) ABSTRACT

A modular and scalable system configured to generate a topology platform for training, entertainment, gaming, living, working, acting, viewing, etc. The platform can have a plurality of movable columns that are extendable and retractable. In some embodiments, some of the columns can be retracted to allow users to walk on the columns while other columns can be extended to form a barrier (e.g., wall) or form an inanimate object (e.g., table). The system may be used in furniture to provide topologies for highly customized support structure designs to accommodate varying body shapes, sizes, and individual comfort levels. The system may be used to generate topologies for greenscreen film stages to provide post-production editing, compositing with actors, stuntmen, and video, etc. The platform can be configurable and re-configurable to change the objects and features of the topology and represent different or dynamic environments at any time.

20 Claims, 10 Drawing Sheets

(51) Int. Cl.
    *E04G 21/16*     (2006.01)
    *E04B 1/35*      (2006.01)
    *G09B 23/04*     (2006.01)
    *G09B 25/00*     (2006.01)
    *G09B 9/00*      (2006.01)
    *G06F 30/10*     (2020.01)

(52) U.S. Cl.
    CPC .............. *G06T 15/08* (2013.01); *G09B 9/003* (2013.01); *G09B 23/04* (2013.01); *G09B 25/00* (2013.01); *G06T 2215/16* (2013.01)

(58) Field of Classification Search
    CPC .... G06T 2215/16; G09B 9/003; G09B 23/04; G09B 25/00
    See application file for complete search history.

(56) References Cited

U.S. PATENT DOCUMENTS

| | | | | |
|---|---|---|---|---|
| 5,113,357 A * | 5/1992 | Johnson | G06T 17/00 | 345/424 |
| 5,364,311 A * | 11/1994 | Chou | A63J 11/00 | 472/62 |
| 5,546,784 A * | 8/1996 | Haas | B21J 13/02 | 72/413 |
| 5,760,530 A * | 6/1998 | Kolesar | H01L 41/1132 | 310/317 |
| 5,796,620 A * | 8/1998 | Laskowski | G05B 19/4207 | 700/118 |
| 6,125,338 A * | 9/2000 | Brienza | G01B 11/24 | 702/167 |
| 6,209,380 B1 * | 4/2001 | Papazian | B21D 37/00 | 72/413 |
| 6,257,575 B1 * | 7/2001 | Ortega | A63F 3/00214 | 273/287 |
| 6,298,587 B1 * | 10/2001 | Vollom | G01B 5/207 | 33/561.1 |
| 6,362,817 B1 * | 3/2002 | Powers | G06T 17/00 | 345/428 |
| 6,462,840 B1 * | 10/2002 | Kravtsov | H04N 13/324 | 348/E13.059 |
| 6,535,201 B1 * | 3/2003 | Cooper | G06F 3/016 | 340/407.1 |
| 6,556,199 B1 * | 4/2003 | Fang | G06T 15/08 | 345/424 |
| 6,578,399 B1 * | 6/2003 | Haas | B21D 47/00 | 72/413 |
| 6,700,563 B1 * | 3/2004 | Koizumi | G01B 5/207 | 700/118 |
| 6,734,785 B2 * | 5/2004 | Petersen | G09B 21/004 | 340/407.1 |
| 6,762,778 B1 * | 7/2004 | Golibrodski | G06F 3/04845 | 715/849 |
| 6,855,062 B1 * | 2/2005 | Truong | A63J 11/00 | 472/136 |
| 6,903,871 B2 * | 6/2005 | Page | B29C 33/307 | 359/893 |
| 6,907,672 B2 * | 6/2005 | Said | G01B 11/24 | 702/167 |
| 7,187,377 B1 * | 3/2007 | Pella | G06T 15/40 | 715/850 |
| 7,245,292 B1 * | 7/2007 | Custy | G06F 3/016 | 345/173 |
| 7,503,758 B2 * | 3/2009 | Reis | B29C 73/06 | 425/468 |
| 7,558,705 B1 * | 7/2009 | Hughes | G06F 30/18 | 174/72 A |
| 7,651,225 B2 * | 1/2010 | Nishikawa | G02B 30/00 | 359/479 |
| 7,852,333 B2 * | 12/2010 | Nishikawa | H04N 13/388 | 345/419 |
| 8,294,758 B2 * | 10/2012 | Lynde | E21B 47/098 | 348/81 |
| 8,295,546 B2 * | 10/2012 | Craig | G06T 17/10 | 382/103 |
| 8,337,440 B2 * | 12/2012 | Cornacchio | A61F 5/01 | 602/8 |
| 8,998,652 B2 * | 4/2015 | Martineau | G06F 3/016 | 324/755.05 |
| 9,142,105 B1 * | 9/2015 | Crofford | G06F 3/016 | |
| 9,298,264 B2 * | 3/2016 | Leithinger | G06F 3/041 | |
| 9,552,915 B2 * | 1/2017 | Khan | H01F 7/064 | |
| 9,587,309 B1 * | 3/2017 | Pickens | C23C 16/01 | |
| 9,858,774 B1 * | 1/2018 | Crofford | G06F 3/016 | |
| 9,874,007 B2 * | 1/2018 | Malitskiy | E04B 1/34357 | |
| 10,222,889 B2 * | 3/2019 | Picciotto | G06F 3/0488 | |
| 10,345,905 B2 * | 7/2019 | McClure | G06F 3/016 | |
| 10,351,287 B2 * | 7/2019 | Eberbach | B65B 55/20 | |
| 10,466,855 B1 * | 11/2019 | Murto | A63F 13/217 | |
| 10,467,807 B1 * | 11/2019 | Strater | B33Y 50/00 | |
| 10,486,057 B2 * | 11/2019 | Henrie | A63F 9/0078 | |
| 10,490,100 B2 * | 11/2019 | Hong | G09B 21/004 | |
| 10,515,177 B1 * | 12/2019 | Ruehl | G06F 30/392 | |
| 10,627,906 B2 * | 4/2020 | Alanis | G09B 21/003 | |
| 10,635,088 B1 * | 4/2020 | Bandara | B29C 64/393 | |
| 10,765,962 B2 * | 9/2020 | King | A63J 11/00 | |
| 10,796,485 B2 * | 10/2020 | Leppänen | G06T 15/20 | |
| 10,845,879 B2 * | 11/2020 | Pohl | G06F 3/011 | |
| 10,884,525 B1 * | 1/2021 | Vonsik | G06F 3/011 | |
| 11,057,612 B1 * | 7/2021 | Clemens | H04N 13/275 | |
| 11,086,398 B2 * | 8/2021 | Gonzalez Franco | G06F 3/017 | |
| 11,087,479 B1 * | 8/2021 | Geraghty | G06T 17/00 | |
| 11,119,569 B2 * | 9/2021 | Nachum | G06F 3/011 | |
| 11,158,126 B1 * | 10/2021 | Petrov | G06F 3/012 | |
| 11,200,355 B2 * | 12/2021 | Razzell | G06F 30/20 | |
| 11,227,510 B2 * | 1/2022 | Memon | G09B 25/04 | |
| 2002/0012004 A1 * | 1/2002 | Deering | G06T 5/002 | 345/589 |
| 2002/0034607 A1 * | 3/2002 | Stoyles | A47G 27/0275 | 8/150 |
| 2002/0170241 A1 * | 11/2002 | Candio | A63J 11/00 | 52/65 |
| 2003/0117490 A1 * | 6/2003 | Tecu | G09B 21/003 | 434/114 |
| 2004/0041820 A1 * | 3/2004 | Sevigny | G06T 1/00 | 345/619 |
| 2004/0056876 A1 * | 3/2004 | Nakajima | G06F 3/016 | 715/702 |
| 2006/0266135 A1 * | 11/2006 | Nishikawa | H04N 13/388 | 73/866.3 |
| 2007/0229557 A1 * | 10/2007 | Okumura | H04N 9/3188 | 345/698 |
| 2007/0247595 A1 * | 10/2007 | Refai | G03B 21/26 | 353/94 |
| 2008/0013049 A1 * | 1/2008 | Nishikawa | H04N 13/275 | 353/7 |
| 2008/0129705 A1 * | 6/2008 | Kim | G06F 3/016 | 345/174 |
| 2008/0150911 A1 * | 6/2008 | Harrison | G06F 3/04886 | 345/173 |
| 2008/0182228 A1 * | 7/2008 | Hafez | G09B 21/004 | 434/114 |
| 2008/0266295 A1 * | 10/2008 | Temesvari | G06T 19/00 | 345/427 |
| 2009/0002383 A1 * | 1/2009 | Bilger | G06T 1/60 | 345/531 |
| 2009/0092289 A1 * | 4/2009 | Rye | G06T 17/10 | 382/113 |
| 2009/0130639 A1 * | 5/2009 | Skinner | G09B 21/003 | 434/114 |
| 2009/0231287 A1 * | 9/2009 | Rogowitz | G06F 3/016 | 345/173 |
| 2011/0210943 A1 * | 9/2011 | Zaliva | G06F 3/04883 | 345/173 |
| 2011/0235332 A1 * | 9/2011 | Cheung | G09F 9/372 | 428/397 |
| 2011/0254916 A1 * | 10/2011 | Fan | G02B 30/52 | 348/E13.026 |
| 2012/0055056 A1 * | 3/2012 | Olson | G09F 13/14 | 40/563 |

(56) References Cited

U.S. PATENT DOCUMENTS

| | | | |
|---|---|---|---|
| 2012/0059637 A1* | 3/2012 | Yu | B29C 33/3835 703/6 |
| 2012/0142415 A1* | 6/2012 | Lindsay | G06T 19/006 463/33 |
| 2012/0197600 A1* | 8/2012 | Bai | G08B 13/1968 703/2 |
| 2013/0141388 A1* | 6/2013 | Ludwig | H03K 17/96 345/174 |
| 2013/0175151 A1* | 7/2013 | Cordoba Matilla | G09B 21/02 200/521 |
| 2013/0300740 A1* | 11/2013 | Snyder | G06T 17/00 345/419 |
| 2013/0321411 A1* | 12/2013 | Pahwa | G06T 17/05 345/420 |
| 2013/0326444 A1* | 12/2013 | Orita | G06F 30/39 716/111 |
| 2014/0063017 A1* | 3/2014 | Kaula | G06T 15/80 345/426 |
| 2014/0132595 A1* | 5/2014 | Boulanger | G06T 13/60 345/619 |
| 2014/0183269 A1* | 7/2014 | Glaser | G06K 19/07701 235/492 |
| 2014/0184947 A1* | 7/2014 | Bolzmacher | G06F 3/04812 349/12 |
| 2014/0313142 A1* | 10/2014 | Yairi | H04M 1/724 345/173 |
| 2015/0073758 A1* | 3/2015 | Le Goff | G06F 30/23 703/2 |
| 2015/0077398 A1* | 3/2015 | Yairi | G06F 3/04886 345/175 |
| 2015/0091834 A1* | 4/2015 | Johnson | G09B 21/003 345/173 |
| 2015/0192996 A1* | 7/2015 | Katou | G06F 3/04886 345/173 |
| 2016/0027216 A1* | 1/2016 | da Veiga | G06F 3/013 345/158 |
| 2016/0067628 A1* | 3/2016 | Reid | A63F 13/92 446/484 |
| 2016/0202761 A1* | 7/2016 | Bostick | G09B 21/004 345/173 |
| 2016/0224167 A1* | 8/2016 | Norieda | G06F 1/1626 |
| 2016/0225137 A1* | 8/2016 | Horovitz | G06T 7/70 |
| 2017/0076494 A1* | 3/2017 | Gabrys | G06T 19/006 |
| 2017/0124767 A1* | 5/2017 | Foust | G06F 3/016 |
| 2017/0150137 A1* | 5/2017 | Kosmiskas | H04N 13/356 |
| 2017/0150138 A1* | 5/2017 | Kosmiskas | H04N 13/398 |
| 2017/0200312 A1* | 7/2017 | Smith | G06T 15/506 |
| 2017/0206807 A1* | 7/2017 | Hong | G09B 21/004 |
| 2017/0220887 A1* | 8/2017 | Fathi | G06T 7/55 |
| 2017/0242485 A1* | 8/2017 | Squair | G06F 3/016 |
| 2017/0256051 A1* | 9/2017 | Dwivedi | G06T 7/13 |
| 2017/0302902 A1* | 10/2017 | Martinello | H04N 13/398 |
| 2017/0358238 A1* | 12/2017 | Casutt | G09B 17/04 |
| 2018/0003319 A1* | 1/2018 | Besse | F16K 99/0038 |
| 2018/0078848 A1* | 3/2018 | Henrie | A63F 9/24 |
| 2018/0095588 A1* | 4/2018 | Klein | H04L 9/3231 |
| 2018/0113669 A1* | 4/2018 | Szeto | G06F 3/04815 |
| 2018/0144525 A1* | 5/2018 | Gutierrez | A63J 1/02 |
| 2018/0157317 A1* | 6/2018 | Richter | G06T 19/006 |
| 2018/0174487 A1* | 6/2018 | Chen | G06F 3/01 |
| 2018/0182160 A1* | 6/2018 | Boulton | G02B 27/017 |
| 2018/0217662 A1* | 8/2018 | Smoot | A63B 24/0021 |
| 2018/0224926 A1* | 8/2018 | Harviainen | G06F 3/016 |
| 2018/0252535 A1* | 9/2018 | Bhimavarapu | G01S 5/0295 |
| 2018/0277292 A1* | 9/2018 | Zarate | G09B 21/004 |
| 2018/0314235 A1* | 11/2018 | Mirabella | G06F 30/23 |
| 2018/0315162 A1* | 11/2018 | Sturm | H04N 13/239 |
| 2018/0374276 A1* | 12/2018 | Powers | G06T 17/205 |
| 2019/0026956 A1* | 1/2019 | Gausebeck | G06T 19/20 |
| 2019/0050057 A1* | 2/2019 | Cho | G06F 3/017 |
| 2019/0098229 A1* | 3/2019 | Lovemelt | H04N 23/11 |
| 2019/0102949 A1* | 4/2019 | Sheftel | H04N 5/265 |
| 2019/0108681 A1* | 4/2019 | McBeth | G06T 19/006 |
| 2019/0111336 A1* | 4/2019 | Gutierrez | A63F 13/217 |
| 2019/0128677 A1* | 5/2019 | Naman | G06T 7/593 |
| 2019/0130650 A1* | 5/2019 | Liu | G06T 13/40 |
| 2019/0139451 A1* | 5/2019 | Drake | G09B 21/004 |
| 2019/0147658 A1* | 5/2019 | Kurabayashi | G06T 15/506 345/423 |
| 2019/0164336 A1* | 5/2019 | Chen | G06F 3/0304 |
| 2019/0178643 A1* | 6/2019 | Metzler | G06F 18/214 |
| 2019/0179977 A1* | 6/2019 | Van der Velden | G06F 30/23 |
| 2019/0180499 A1* | 6/2019 | Caulfield | G06T 1/20 |
| 2019/0199993 A1* | 6/2019 | Babu J D | G06F 3/00 |
| 2019/0206141 A1* | 7/2019 | Deng | G06V 40/172 |
| 2019/0214174 A1* | 7/2019 | Bertora | H01F 7/1646 |
| 2019/0221030 A1* | 7/2019 | Griffin | A63J 1/02 |
| 2019/0221031 A1* | 7/2019 | de la Carcova | A63J 5/02 |
| 2019/0221036 A1* | 7/2019 | Griffin | A63G 31/16 |
| 2019/0222777 A1* | 7/2019 | Lovemelt | H04N 23/55 |
| 2019/0232500 A1* | 8/2019 | Bennett | G06T 19/006 |
| 2019/0236842 A1* | 8/2019 | Bennett | G06F 3/011 |
| 2019/0324474 A1* | 10/2019 | Wendt | G05D 1/0242 |
| 2019/0347961 A1* | 11/2019 | Memon | G09B 21/004 |
| 2019/0355276 A1* | 11/2019 | Rami | G09B 21/009 |
| 2020/0051527 A1* | 2/2020 | Ngo | G06F 3/1423 |
| 2020/0064911 A1* | 2/2020 | Mine | G06F 3/0304 |
| 2020/0074016 A1* | 3/2020 | Chong | G06F 30/00 |
| 2020/0088758 A1* | 3/2020 | Smoot | H04W 4/027 |
| 2020/0122196 A1* | 4/2020 | Kobrin | B06B 1/0629 |
| 2020/0150624 A1* | 5/2020 | Marinov | G06F 30/10 |
| 2020/0151923 A1* | 5/2020 | Bergin | G06T 17/10 |
| 2020/0164283 A1* | 5/2020 | King | A63J 11/00 |
| 2020/0242969 A1* | 7/2020 | Lubiner | G09B 21/004 |
| 2020/0265122 A1* | 8/2020 | Razzell | B22F 10/66 |
| 2020/0293112 A1* | 9/2020 | Richter | G06F 3/011 |
| 2020/0312187 A1* | 10/2020 | Jung | G09B 21/004 |
| 2020/0326814 A1* | 10/2020 | Li | G06F 3/042 |
| 2020/0342067 A1* | 10/2020 | Yu | G06F 30/20 |
| 2020/0382681 A1* | 12/2020 | Smithwick | H04N 9/3179 |
| 2021/0012689 A1* | 1/2021 | Simmons | H04N 13/393 |
| 2021/0033790 A1* | 2/2021 | Ward | B81B 3/0083 |
| 2021/0042992 A1* | 2/2021 | Newman | G06T 19/006 |
| 2021/0049812 A1* | 2/2021 | Ganihar | G06T 17/05 |
| 2021/0056750 A1* | 2/2021 | Rowley | G06T 7/292 |
| 2021/0073449 A1* | 3/2021 | Segev | G06F 30/27 |
| 2021/0090321 A1* | 3/2021 | Constable | G02B 27/017 |
| 2021/0096726 A1* | 4/2021 | Faulkner | G06F 1/1686 |
| 2021/0097765 A1* | 4/2021 | Lehman | G06T 7/20 |
| 2021/0103268 A1* | 4/2021 | Tang | B29C 64/386 |
| 2021/0132687 A1* | 5/2021 | Luo | G06F 3/011 |
| 2021/0149489 A1* | 5/2021 | Marcolino Quintao Severgnini | G06F 3/03547 |
| 2021/0150805 A1* | 5/2021 | Stekovic | G06T 7/11 |
| 2021/0178252 A1* | 6/2021 | LaHorgue | G06F 16/9024 |
| 2021/0255328 A1* | 8/2021 | Sanjeev | A63F 13/28 |
| 2021/0263498 A1* | 8/2021 | Bandara | B33Y 10/00 |
| 2021/0350036 A1* | 11/2021 | Burla | G06F 30/12 |
| 2021/0356939 A1* | 11/2021 | Eom | G06F 30/20 |
| 2021/0365004 A1* | 11/2021 | Weinberg | G06F 30/20 |
| 2021/0365007 A1* | 11/2021 | Kim | G05B 19/4099 |
| 2021/0375158 A1* | 12/2021 | Ayana | G09B 21/004 |
| 2021/0406412 A1* | 12/2021 | Cramer | G06F 30/10 |
| 2022/0012378 A1* | 1/2022 | Chen | G06F 30/23 |
| 2022/0114787 A1* | 4/2022 | Loodin Ek | A63F 13/63 |
| 2022/0122326 A1* | 4/2022 | Reitmayr | H04N 23/698 |
| 2022/0143509 A1* | 5/2022 | Griesemer | A63F 13/60 |
| 2022/0156426 A1* | 5/2022 | Ham | G06V 10/764 |
| 2022/0189127 A1* | 6/2022 | Matsuo | G09G 5/00 |
| 2022/0236075 A1* | 7/2022 | Ho | G01C 21/3837 |
| 2022/0262115 A1* | 8/2022 | Zhang | G06T 17/05 |
| 2022/0268039 A1* | 8/2022 | Ford | E04G 21/0463 |
| 2022/0335681 A1* | 10/2022 | Horikawa | G06V 20/60 |
| 2022/0383539 A1* | 12/2022 | Hill | A63F 13/428 |
| 2022/0383594 A1* | 12/2022 | Li | G06V 10/25 |

(56) References Cited

U.S. PATENT DOCUMENTS

2022/0398940 A1* 12/2022 Likova ................. G09B 21/003
2023/0147866 A1* 5/2023 Pickering ............ E04B 1/34861
                                                              52/79.1

OTHER PUBLICATIONS

Asif Khan, "The Kinetic Facade of the MegaFaces Pavilion, Sochi 2014 Winter Olympics", Feb. 7, 2014 (4 pages).

* cited by examiner

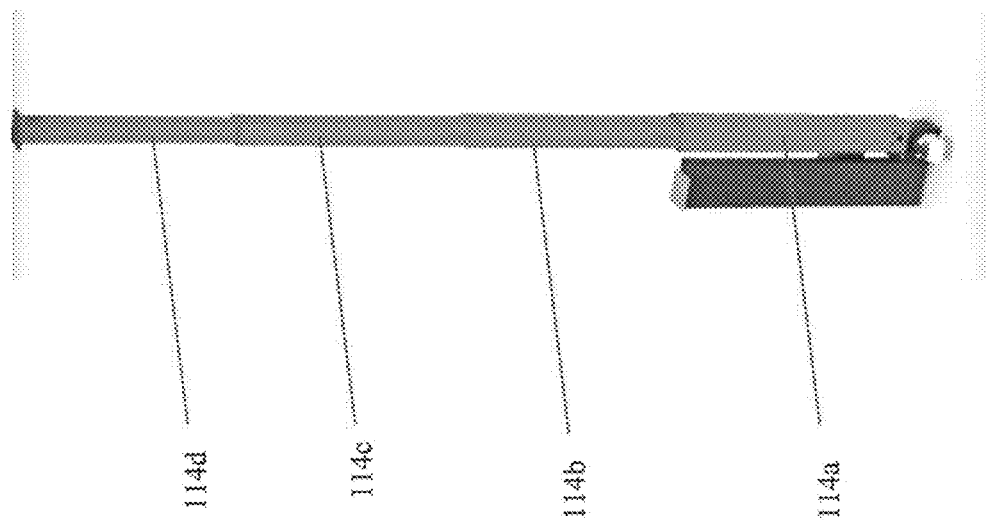

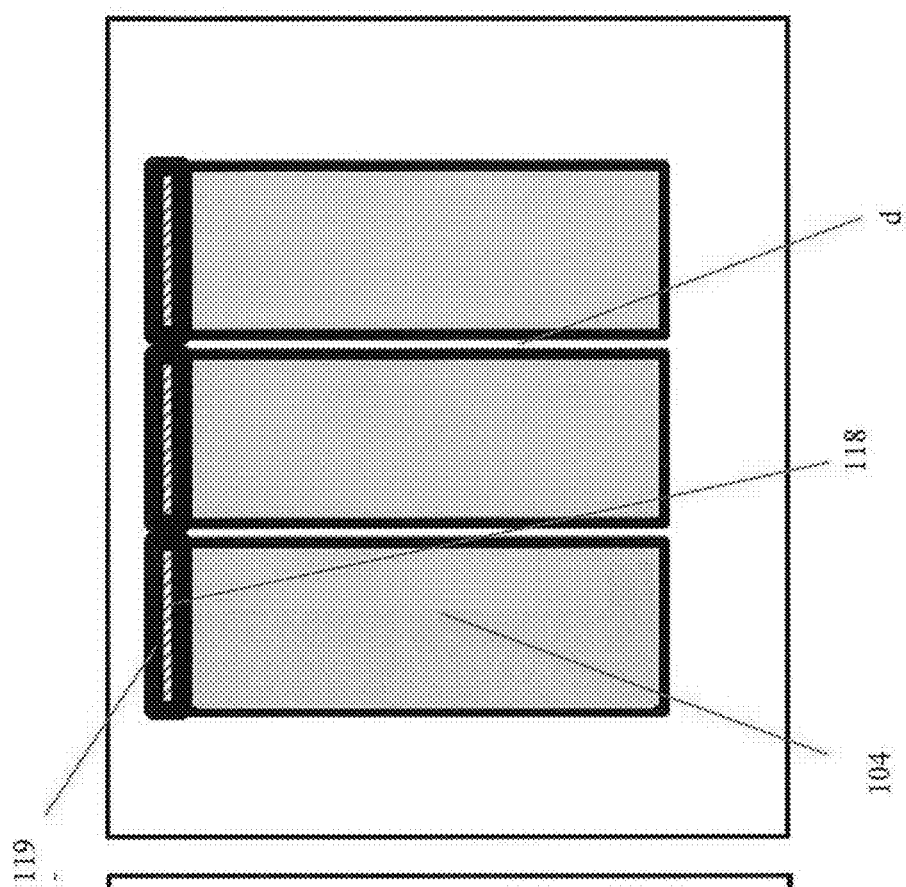
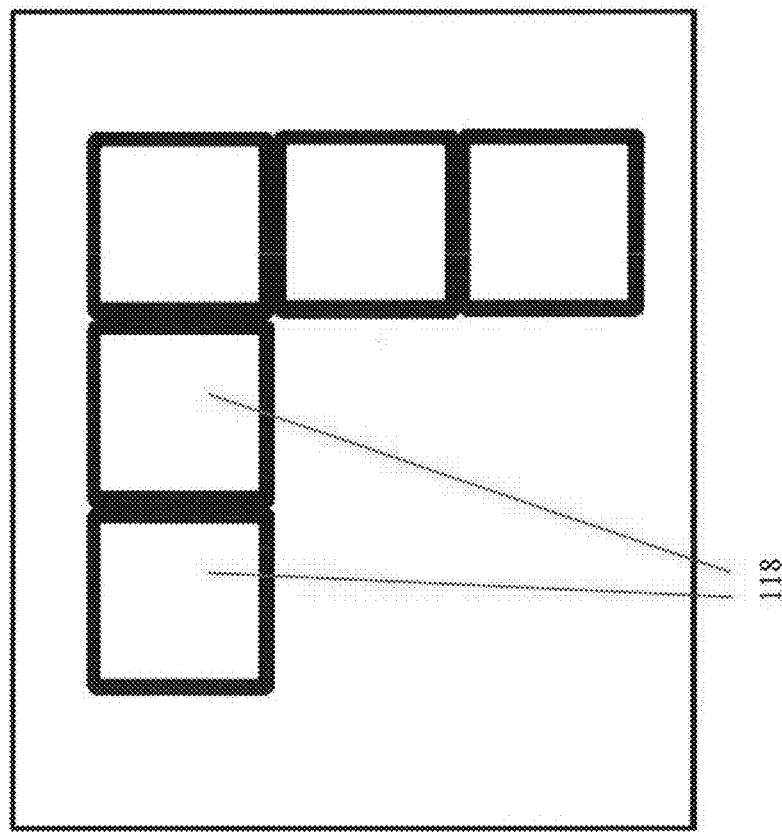

LOCATION-BASED VR TOPOLOGICAL EXTRUSION APPARATUS

CROSS-REFERENCE TO RELATED APPLICATIONS

This application is related to and claims the benefit of U.S. provisional application 62/640,241 filed on Mar. 8, 2018, the contents of which is incorporated herein by reference in its entirety.

FIELD OF THE INVENTION

The present invention relates to a modular and scalable system configured to generate a virtual and corresponding physical mock environment topology that is configurable and re-configurable via a platform having a plurality of actuatable columns.

BACKGROUND OF THE INVENTION

Virtual environments can be used for training exercises (e.g., military, police, firefighter, rehearsal, etc.), entertainment (e.g., amusement park themes, virtual video games, etc.), marketing (e.g., construction and real estate previews), artistic presentations, etc. Conventional virtual environment systems can be limited in function and versatility. For example, conventional virtual environment systems are generally static mock set-up platforms that offer little realism, provide little to no re-configuration, and offer limited tactile feedback.

Conventional non-virtual and real-world objects and environments (e.g., furniture, walls, countertops, shelves, and flooring) can be static or offer limited function and versatility. For example, conventional furniture construction typically affords users with no physical customization or few physical customization options and conventional construction offers few physical customization options and precludes full customization of physical spaces without significant redesign and remodeling processes.

In addition, conventional greenscreen film stages can be static or offer limited function and versatility. For example, most greenscreen film stages are either devoid of physical structures which are later added in post-production or include conventionally designed set pieces that are either destroyed or placed into storage at the conclusion of production.

The present invention is directed towards overcoming at least one of the above-identified problems.

SUMMARY OF THE INVENTION

Embodiments can include a modular and scalable system configured to generate a topology representing a three-dimensional (3D) shape. The topology can be used for a variety of applications, including but not limited to virtual environment systems, non-virtual environment systems, etc. Non-virtual environment systems can include automation of residential and industrial interior site construction (e.g., automation of home interiors, manufacturing line support structures, warehouse support structures, etc.), automated film stage/greenscreen support structure, customizable furniture, etc.

Some embodiments can include a virtual environment system configured to generate a virtual and corresponding physical mock physical environment topology in which users can operate for training, entertainment, gaming, living, working, viewing, etc. Embodiments of the system can include a platform comprising a plurality of movable columns, each column actuated by an actuator to cause the column to extend or retract. For example, at least some of the columns of the platform can be retracted to allow users to walk on the columns. The columns can be extended to form a barrier (e.g., wall) or form an object (e.g., table). As the platform can comprise a plurality of actuating columns, the platform can be configurable and re-configurable to change the objects and features of the virtual environment and represent different or dynamic environments rapidly and at any time. The scalability and modular design of the system can facilitate quick and easy configuration and re-configuration of the physical mock physical environment.

In some embodiments, the system can be utilized in furniture and configured to generate a topology that affords users with a highly customized support structure designed to accommodate varying body shapes, sizes, and individual comfort levels. For example, a recliner chair with a headrest, neck rest, backrest, seat, arm rest, and footrest can have an embodiment of the system associated with it to provide adjustable firmness and height control. Another example can be a bed mattress or car seat having an embodiment of the system providing similar configurability to the mattress or seat.

In some embodiments, the system can be utilized in a greenscreen film stage. For instance, the system can be used to generate the shape of film stage objects that are edited out of footage and that are replaced with computer-generated imagery or video, for example, a configurable stage that generates the shapes of walls, windows, doors, props, debris for post-production greenscreen editing of footage for compositing with actors, stuntmen, and video.

Some embodiments can include use of a 3-dimensional (3D) rendering of a real environment to generate a topology that is representative of the real environment. The 3D topology rendering can be used as a guide for actuation of certain columns of the platform to generate the virtual environment.

As used herein, the virtual environment generated by an embodiment of the system can include a physical mock representation of a real environment. In some embodiments, other computer-generated scenario simulations can be used in conjunction with the physical mock representation to provide a hyperreality environment. The reconfigurable and dynamic nature of the system (e.g., not being limited to prefabricated parts and static portions) can allow for generating a virtual environment that is a visuotactile integration of various objects, the objects being generated by the columns. For example, objects such as tables, countertops, walls, etc. can be generated via different column formations. These objects can be representative of objects of the real environment, resulting in a tactile feedback hyperreality environment. In addition, embodiments of the system can provide for automatic detection of real environment shape, automatic virtual environment production, fast virtual environment production (e.g., simulate many virtual environments quickly), a reduced need for set construction/materials/staff, and infinite environment traversal and reuse.

In at least one embodiment, a platform for a virtual environment system can include a plurality of columns. Each column can be configured as a plurality of engaged members. Each column can include a first end and a second end. The platform can include a plurality of actuators. At least one actuator can be in mechanical connection with at least one column. The at least one actuator can be configured to cause the at least one column to extend and retract. In some embodiments, when the at least one column is fully retracted, the second end is positioned at a first location. In some embodiments, when the at least one column is fully extended, the second end is positioned at a second location. In some embodiments, when the column is between being fully retracted and fully extended, the second end is positioned at an intermediate location.

In some embodiments, the second end of the at least one column can include a plate. In some embodiments, the plurality of columns can include an array of columns arranged in a side-by-side configuration. In some embodiments, the plurality of columns can include an array of vertically, horizontally, or any angle there-between orientated columns arranged in a side-by-side configuration. In some embodiments, each column can be adjacent another column and each column may be separated by another column by a gap d. In some embodiments, each column can include a sleeve shrouding at least a portion of the column. In some embodiments, the plate can include an end cap covering at least a portion of the plate.

The end caps can be a static type end cap and/or a dynamic type end cap. The static type end cap is a cap that is configured as a cover for a portion of the plate. Static type end caps can provide a particular shape affixed to the top of a column. The dynamic type end cap is a cap that has at least one smaller column-actuator arrangement with an associated cap top configured to allow extension and retraction of the cap end to provide further topological customization and to include finer surface detail than that provided by its larger columns-actuator counterpart. While static style end caps provide a predefined shape to the top columns, the dynamic end caps are smaller versions of the column-actuator arrangements that provide customizable shape to the top of columns. Any of the static end caps or dynamic end caps can be of any shape or size.

In at least one embodiment, a virtual environment system can include a platform having a plurality of columns configured in an array. Each column can be configured as a plurality of engaged members. Each column can include a first end and a second end. The system can include plurality of actuators. At least one actuator can be in mechanical connection with at least one column. The at least one actuator can be configured to cause the at least one column to extend and retract. In some embodiments, when the at least one column is fully retracted, the second end is positioned at a first location. In some embodiments, when the at least one column is fully extended, the second end is positioned at a second location. In some embodiments, when the column is between being fully retracted and fully extended, the second end is positioned at an intermediate location.

The system can include a computer device configured to generate a virtual grid of the platform, wherein a position of each column in the array corresponds to a column coordinate point. The system can include a scanner configured to generate a 3D topology rendering of a real environment, the 3D topology rendering comprising real environment coordinate points. In some embodiments, the computer device can co-register the real environment coordinate points of the 3D topology rendering to the column coordinate points of the virtual grid. In some embodiments, the computer device can cause the plurality of actuators to actuate in accordance with the 3D topology rendering to cause the plurality of columns to move to the first location, the intermediate location, and/or the second location to generate a virtual environment.

In some embodiments, the virtual environment can be a physical mock representation of the real environment. In some embodiments, the virtual environment further comprises props positioned on the platform. In some embodiments, the second ends of the columns of the platform can be configured to provide a walking surface for users.

In some embodiments, the array of columns can include at least one row of columns. When columns within the at least one row are fully extended to cause the second end of each column to be positioned at the second location, a virtual wall of the virtual environment representing a physical wall of the real environment can be generated. In some embodiments, when at least one column within the columns forming the virtual wall is positioned to be at the intermediate location, a virtual window opening of the virtual environment representing a physical window opening of the real environment can be generated.

In some embodiments, the array of columns can include a plurality of rows of columns. When columns within the plurality of rows are extended to cause the second end of each column to be positioned at the intermediate location, a virtual object of the virtual environment representing a physical object of the real environment can be generated.

In some embodiments, at least one actuator can include a safety stop configured to prevent movement of the column. In some embodiments, the system can include at least one camera positioned above the platform.

In at least one embodiment, a method of generating virtual environment can involve generating a platform comprising a plurality of columns configured in an array. The method can involve generating a virtual grid of the platform, wherein a position of each column in the array corresponds to a column coordinate point. The method can involve generating a 3D topology rendering of a real environment, the 3D topology rendering comprising real environment coordinate points. The method can involve co-registering the real environment coordinate points of the 3D topology rendering to the column coordinate points of the virtual grid. The method can involve causing the plurality of columns to move in accordance with the 3D topology rendering to generate a virtual environment that is a physical mock representation of the real environment. Some embodiments of the method can involve use of computer-generated scenario simulations to provide a hyperreality environment.

In at least one embodiment, the actuators and associated columns are provided as modules that enable the easy transport and scalable assembly of the modules into the total size required for deployment and use. An exemplary arrangement of modules may be connected together to take the shape of a square or rectangular or other geometric grid of modules. However, the modules may also be arranged as individual units and in other arrangements such as in a line, star, diamond, circle, ellipse, or cross formation, etc.

In one embodiment, a scalable, modular topology system can include at least one platform, each platform including: a plurality of columns, each column having at least one member, wherein each column has a first end and a second end. The system can include a plurality of actuators, at least one actuator in mechanical connection with at least one column, the at least one actuator configured to cause the at least one column to extend and retract. When the at least one column is fully retracted, the second end is positioned at a first location. When the at least one column is fully extended, the second end is positioned at a second location. When the column is between being fully retracted and fully extended, the second end is positioned at an intermediate location.

In some embodiments, the second end of at least one column has a plate. In some embodiments, the plate has at least one of: a static type end cap; and a dynamic type end cap. In some embodiments, each column includes a plurality of telescopingly engaging members. In some embodiments, the plurality of columns forms an array of columns arranged in a side-by-side configuration. In some embodiments, the plurality of columns forms an array of vertically, horizontal, or any angle there-between orientated columns arranged in a side-by-side configuration. In some embodiments, each column is adjacent another column and each column is separated by another column by a gap d. In some embodiments, each column has a sleeve shrouding at least a portion of the column. In some embodiments, at least one of the actuators is controlled manual or via a computer device.

In one embodiment, a scalable, modular topology system can include a platform including a plurality of columns configured in an array, each column configured as a plurality of engaged members, each column having a first end and a second end. The system can include a plurality of actuators, at least one actuator in mechanical connection with at least one column, the at least one actuator configured to cause the at least one column to extend and retract. When the at least one column is fully retracted, the second end is positioned at a first location. When the at least one column is fully extended, the second end is positioned at a second location. When the column is between being fully retracted and fully extended, the second end is positioned at an intermediate location. The system can include a computer device configured to generate a virtual grid of the platform, wherein a position of each column in the array corresponds to a column coordinate point. The system can include a scanner configured to generate a 3-dimensional (3D) topology rendering of a real environment, the 3D topology rendering comprising real environment coordinate points. The computer device co-registers the real environment coordinate points of the 3D topology rendering to the column coordinate points of the virtual grid. The computer device causes the plurality of actuators to actuate in accordance with the 3D topology rendering to cause the plurality of columns to move to the first location, the intermediate location, and/or the second location to generate a virtual environment.

In some embodiments, the virtual environment is a physical mock representation of the real environment. In some embodiments, the virtual environment further includes props generated by the columns of the platform. In some embodiments, the second ends of the columns of the platform are configured to provide a walking surface for users. In some embodiments, the array of columns forms at least one row of columns, wherein when columns within the at least one row are fully extended to cause the second end of each column to be positioned at the second location, a virtual wall of the virtual environment representing a physical wall of the real environment is generated. In some embodiments, when at least one column within the columns forming the virtual wall is positioned to be at the intermediate location, a virtual window opening of the virtual environment representing a physical window opening of the real environment is generated. In some embodiments, the array of columns comprises a plurality of rows of columns, wherein when columns within the plurality of rows are extended to cause the second end of each column to be positioned at the intermediate location, a virtual object of the virtual environment representing a physical object of the real environment is generated. In some embodiments, at last one actuator has a safety stop configured to prevent movement of the column. In some embodiments, the system includes at least one sensor.

A method of generating a topology can involve generating a platform comprising a plurality of columns configured in an array. The method can involve generating a virtual grid of the platform, wherein a position of each column in the array corresponds to a column coordinate point. The method can involve generating a 3-D topology rendering of a real environment, the 3-D topology rendering comprising real environment coordinate points. The method can involve co-registering the real environment coordinate points of the 3-D topology rendering to the column coordinate points of the virtual grid. The method can involve causing the plurality of columns to move in accordance with the 3-D topology rendering to generate a topology that is a physical mock representation of the real environment. In some embodiments, the method involves use of computer-generated scenario simulations to provide a hyperreality environment.

A method for customizing furniture can involve attaching an embodiment of the system to a structural support of the furniture, and actuating at least one column to provide a customized support structure for accommodating varying body shapes, sizes, and individual comfort levels.

A method for customizing a greenscreen film stage can involve placing an embodiment of the system within a greenscreen film stage, and actuating at least one column to generate shapes and sizes for objects and structures for further processing and editing via greenscreen editing.

Further features, aspects, objects, advantages, and possible applications of the present invention will become apparent from a study of the exemplary embodiments and examples described below, in combination with the Figures, and the appended claims.

BRIEF DESCRIPTION OF THE DRAWINGS

The above and other objects, aspects, features, advantages and possible applications of the present innovation will be more apparent from the following more particular description thereof, presented in conjunction with the following drawings. Like reference numbers used in the drawings may identify like components.

FIG. 5 shows an exemplary column and actuator assembly in an extended position.

FIG. 7A shows another top view of an exemplary column arrangement that can be used with an embodiment of the platform.

FIG. 7B shows another side view of an exemplary column arrangement that can be used with an embodiment of the platform.

DETAILED DESCRIPTION OF THE INVENTION

The following description is of exemplary embodiments that are presently contemplated for carrying out the present invention. This description is not to be taken in a limiting sense, but is made merely for the purpose of describing the general principles and features of the present invention. The scope of the present invention is not limited by this description.

Figure 1:
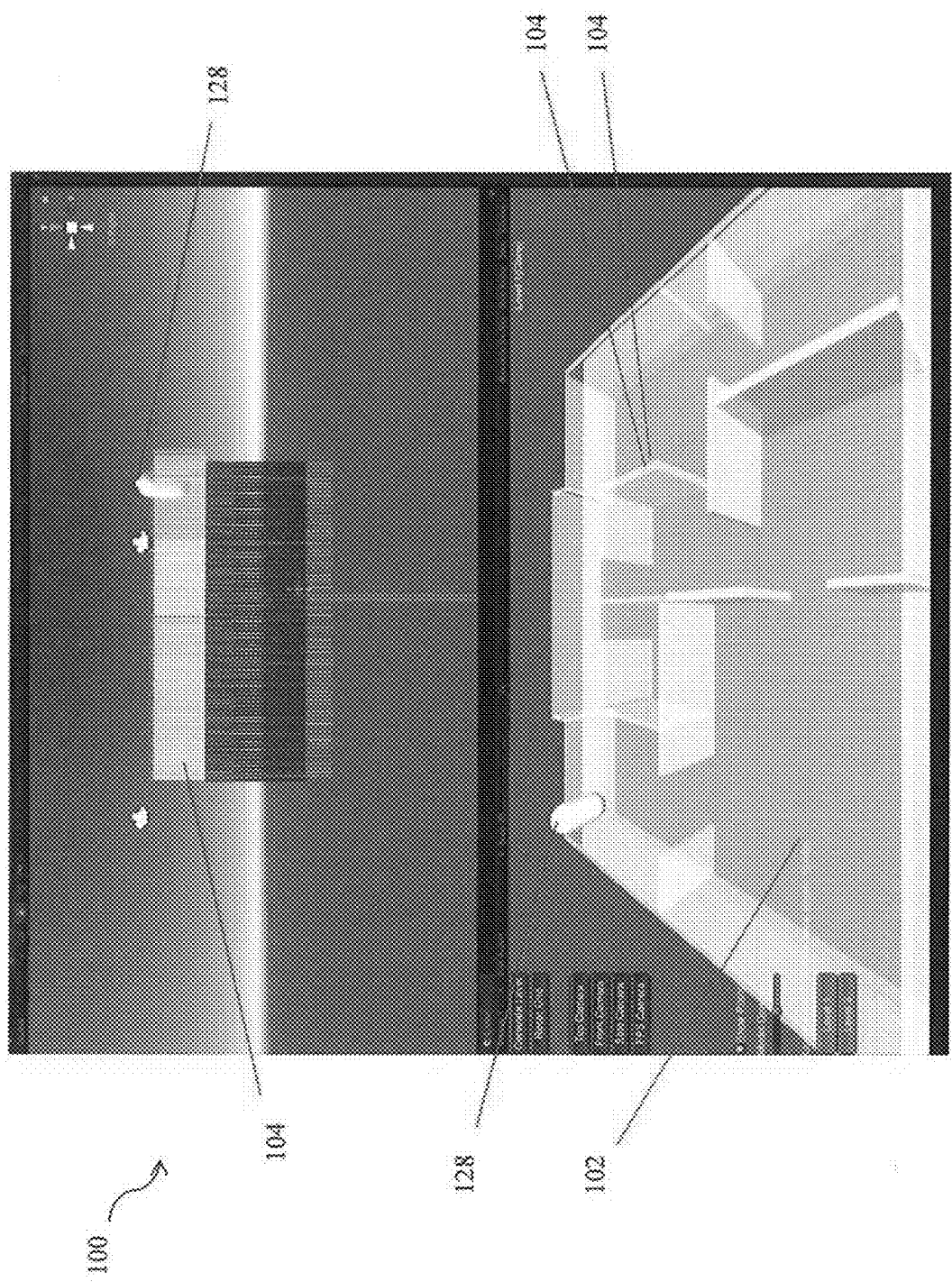
FIG. 1 shows a side view and a perspective view of an exemplary virtual reality environment that can be generated with an embodiment of the system.
Figure 2:
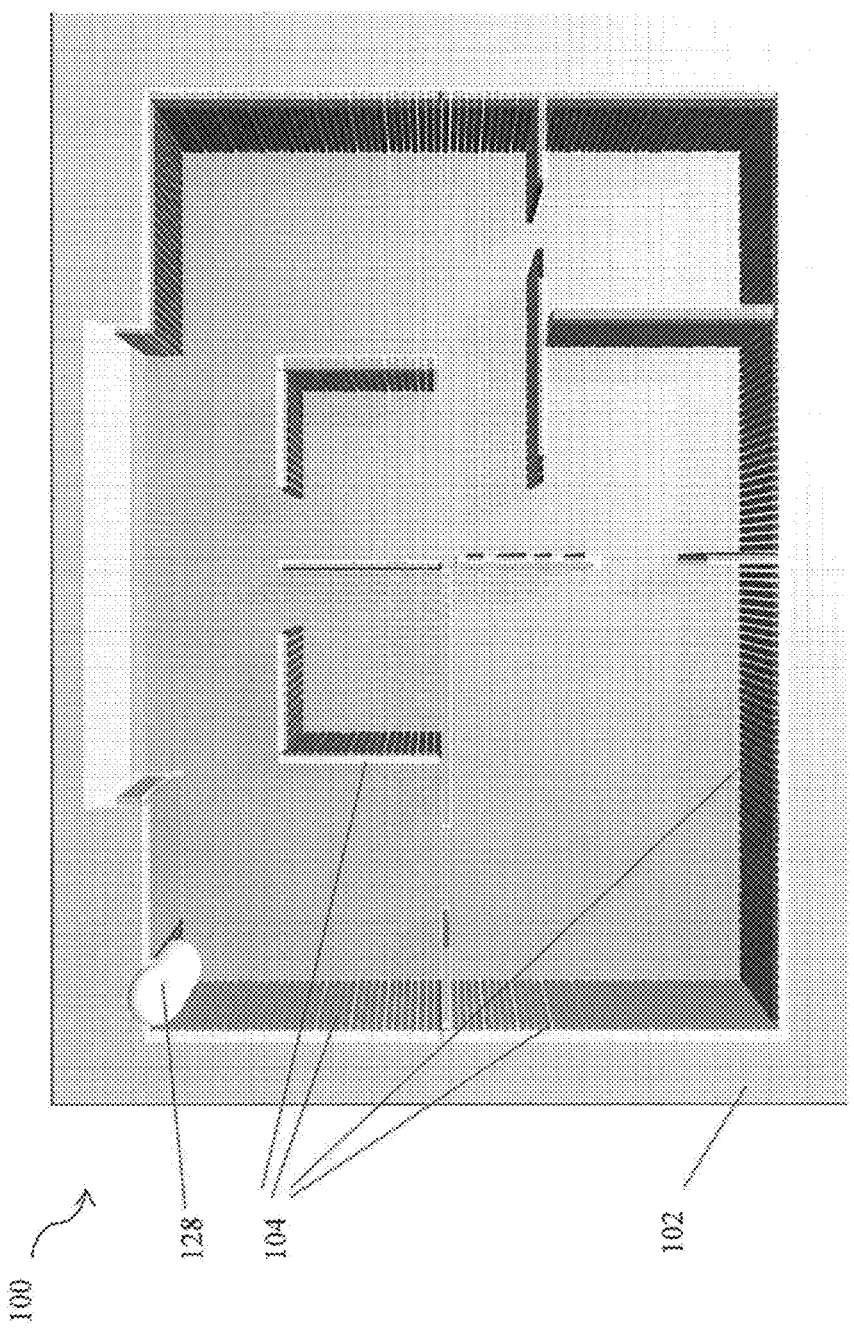
FIG. 2 shows a top view of an exemplary virtual reality environment that can be generated with an embodiment of the system.
Figure 3:
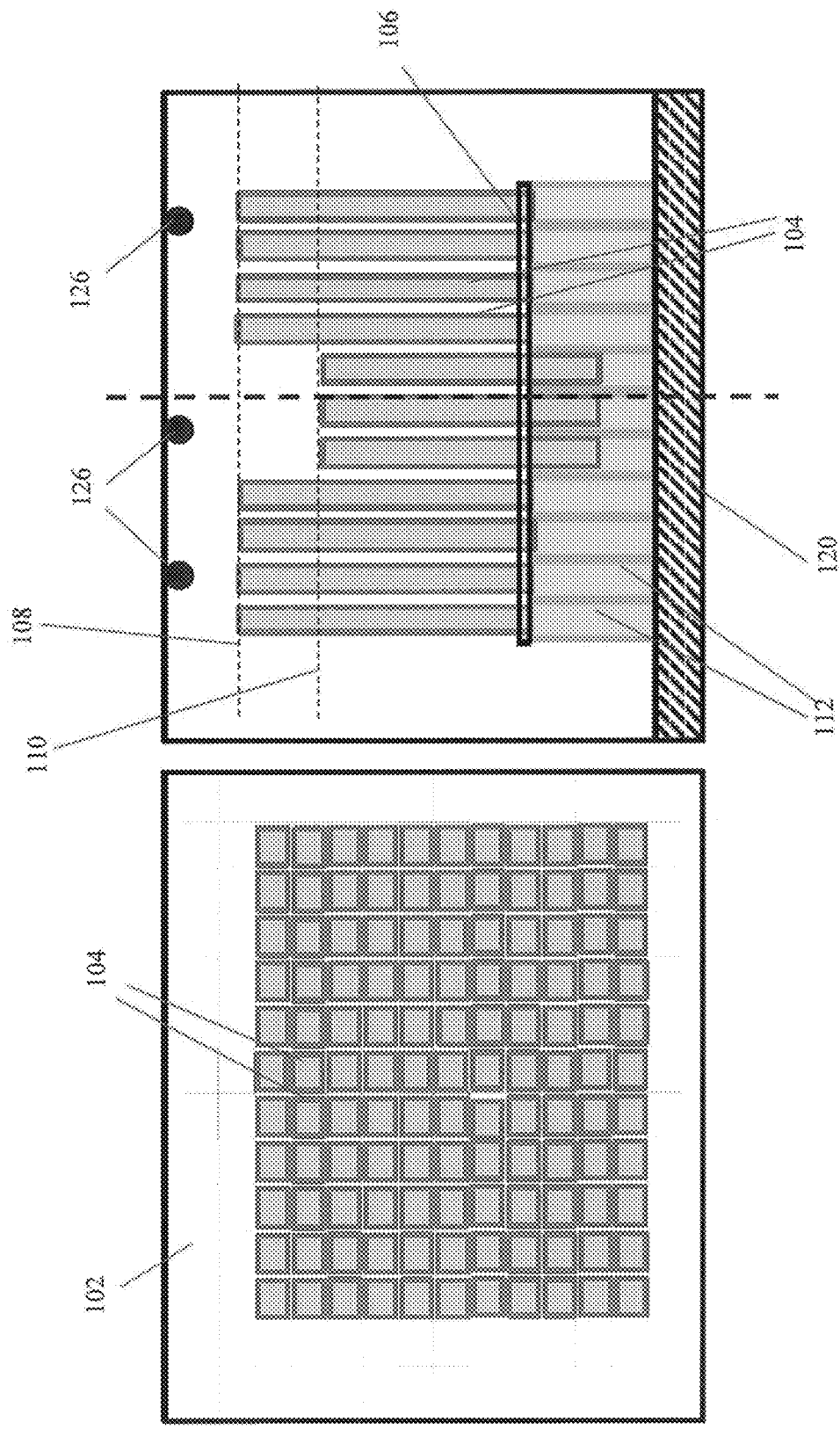
FIG. 3A shows a top view of an exemplary platform that can be used with an embodiment of the system.
FIG. 3B shows a side view of an exemplary platform that can be used with an embodiment of the system.

Referring to FIGS. 1-3, embodiments can include a system 100 configured as modular and scalable system to generate a topology representing a three-dimensional (3D) shape. The topology can be used for a variety of applications, including but not limited to virtual environment systems, non-virtual environment systems, etc. Non-virtual environment systems can include automation of residential and industrial interior site construction (e.g., automation of home interiors, manufacturing line support structures, warehouse support structure, etc.), automated film stage/greenscreen support structure, customizable furniture, etc. As one example, embodiments of the system 100 can be configured to generate a virtual environment in which users can operate. The virtual environment can be a representation of a real environment (e.g., a room, a floor-plan, etc.).

Operating in the environment can include moving about within the environment. This can include moving about for training, entertainment, gaming, living, working, acting, viewing, etc. In some embodiments, the virtual environment can be configurable and/or re-configurable. For example, embodiments of the system 100 can include a platform 102 comprising at least one column 104. The column 104 can be a member 114 that is actuated by an actuator 112 to cause the column 104 to extend and to retract. The column 104 can be extended from a first location 106 and extend to a second location 108. The first location 106 can be a "floor level" of the virtual environment, an operating state of a non-virtual environment (e.g., a distance at which the column 104 provides a predetermined firmness, lumbar support, height adjustment, etc. for furniture), a shape or dimensional parameter of a non-virtual environment (e.g., a surface ornamentation for a prop used in a film stage or greenscreen setting), etc. The second location 108 can be a maximum extension point for the column 104. The actuator 112 can be configured to cause the column 104 to be extended or retracted to a first location 106, a second location 108, and/or an intermediate location 110 the intermediate location 110 being defined as a point between the first location 106 and the second location 108.

The column 104 can be walked on, lean on, or touched by a user, climbed on, used as a support by the user or by another object, etc. For example, at least some of the columns 104 of the platform 102 can be retracted to the first location 106 to form a floor level, ceiling, interior or exterior wall, or any other surface, and to allow users to walk on, lean on, touch, or climb on those columns 104. The column 104 can also be used as a barrier (e.g., form a wall) or used to as an object (e.g., form a bench or table). For example, some columns 104 of the platform 102 can be extended to the second location 108 to form a wall. Some columns 104 of the platform 102 can be extended to an intermediate location 110 to form a bench, a countertop, etc. There can be a plurality of columns 104, and thus any number of columns 104 can be set to differing intermediate locations to form steps, for example. As non-limiting examples, the columns 104 can be adjusted in length to provide a static or dynamic topology for use as a playroom game room, training room, obstacle course, fitness room, rock-climbing course, etc.

As the platform 102, in some embodiments, can comprise a plurality of actuating columns 104, the platform 102 can be configurable and/or re-configurable to change the virtual environment. Configuring and/or re-configuring the topology can be done to represent different or dynamic environments at any time. For example, the system 100 can be configured to represent a hide-out to train police for a raid, and then be re-configured to represent a battlefield for training soldiers, and then be re-configured for providing a virtual scene for gamers. As another example, objects or walls within the virtual environment can be changed while users operate in the environment to provide a dynamic environment for users. For example, a wall can be re-configured to have an opening so as to represent a scenario in which a hole was created in the wall as part of a raid exercise. As another example of a dynamic environment, any one or combination of columns 104 can be actuated in sequential order or in some other operating scheme to generate a wave motion, actuating doors, opening and closing of holes, etc.

Embodiments of the system 100 can include a platform 102. The platform 102 can made from at least one column 104. Some embodiments of the platform 102 can be made from a plurality of columns 104. For example, the platform 102 can include an array of columns 104. As the columns 104 can be extended and retracted, the platform 102 can be configured as an extrusion mesh floor, ceiling, wall, or other surface. For example, any column 104 within the array of columns 104 can be extended ("extruded") and retracted to form a predetermined virtual environment. In an exemplary, non-limiting embodiment, the array of columns 104 can be arranged to generate a square platform 102. For example, the platform 102 can include a plurality of columns 104 arranged adjacent each other to form a first row. Another plurality of columns 104 can be arrange adjacent each other to form a second row. Another plurality of columns 104 can be arrange adjacent each other to form a third row. And so on. The number of columns 104 in each row and the number of rows can be set to generate a square platform 102 comprising the plurality of rows. Other shaped platforms 102 can be generated. These can include a rectangular platform, a circular platform, a triangular platform, a hexagonal platform, etc.

Figure 4:
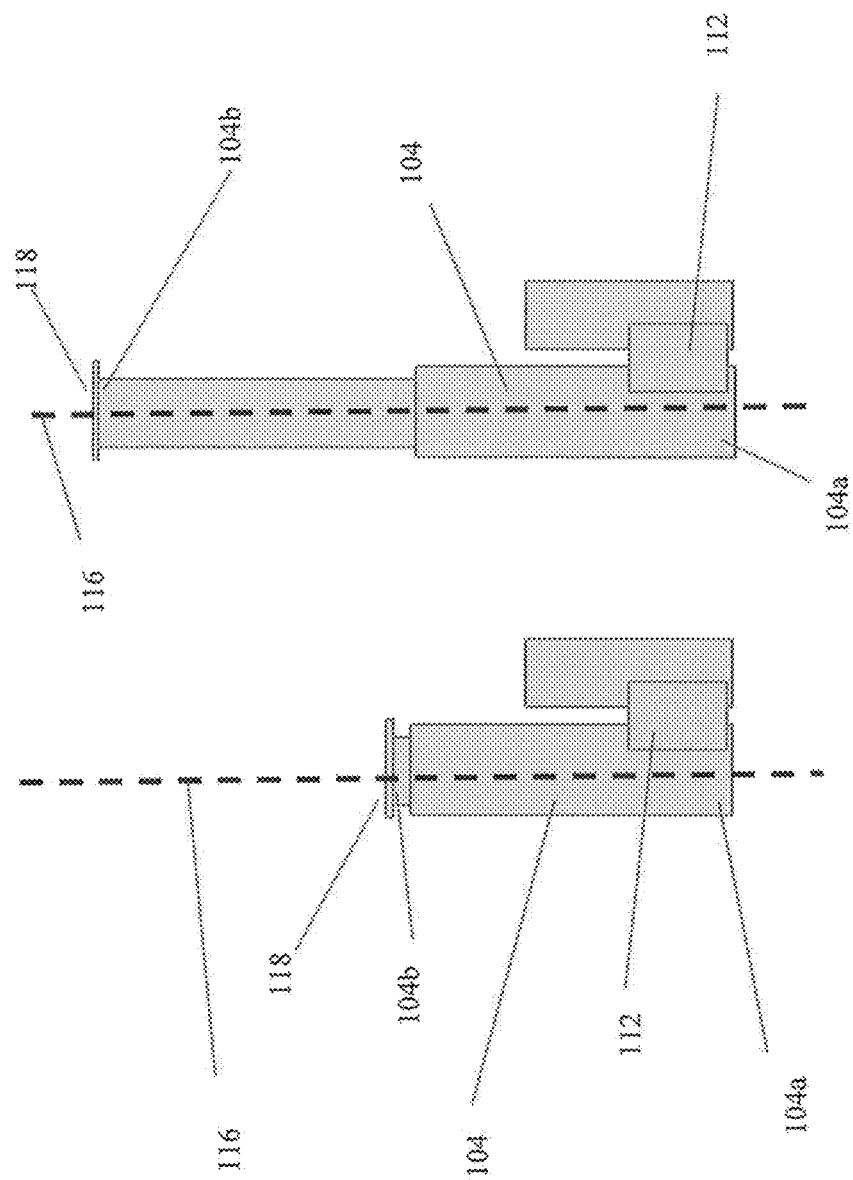
FIG. 4 shows an exemplary column and actuator assembly in a retracted and extended positions.

Referring to FIGS. 4-5, a column 104 can include at least one member 114. The column 104 can be in mechanical connection with an actuator 112. The actuator 112 can be configured to cause the member 114 to extend and retract. Each member can be a structure having a shape. The shape can be square, rectangular, circular, triangular, hexagonal, etc. The shape of any one column 104 can be the same as or different from the shape of another column 104. In some embodiments, a column 104 can include a plurality of engaged members 114. This can include a plurality of telescopingly engaged member 114. The actuator 112 can be configured to cause the plurality of engaged members 114 to extend and retract. This may be done to extend or retract the column 104. The actuator 112 can be an electric motor, a hydraulic motor, a pneumatic motor, etc. Some embodiments can include an individual actuator 112 connected to an individual column 104. Some embodiments can include a single actuator connected to a plurality of columns 104.

The column 104 can include a first end 104a and a second end 104b. The column 104 can have a longitudinal axis 116 running from the first end 104a to the second end 104b. In some embodiments, the platform 102 can be configured such that the column 104 is held in a vertical, horizontal, or any angle there-between position. When the column 104 is in the vertical position, the first end 104a can be a bottom of the column 104 and the second end 104b can be the top of the column 104. As noted herein, the column 104 can include a plurality of engaged members 114 that is configured to extend and retract along the longitudinal axis 116. When the plurality of members 114 are fully retracted, the column second end 104b can be at the first location 106. The first location 106 can be defined as the point along the longitudinal axis 116 that is most proximate to the surface 120. When the plurality of members 114 are fully extended, the column second end 104b can be at the second location 108. The second location 108 can be defined as the point along the longitudinal axis 116 that is most distal to the surface 120. When the plurality of members 114 is between being fully retracted and fully extended, the column second end 104b can be at the intermediate location 110. The intermediate location 110 can be defined as a point along the longitudinal axis 116 that is between the most proximate point and the most distal point.

In some embodiments, the second end 104b can have a plate 118 disposed on a portion thereof. The plate 118 can be a planar object. The plate 118 can have a square shape. Other shapes can include a rectangular shape, a circular shape, a triangular shape, a hexagonal shape, etc. In addition, a surface of the plate 118 can be smooth, undulating, angled, etc. The plate 118 can be configured to be a top surface of the platform. For example, in embodiments with the platform 102 comprising a plurality of vertically orientated columns 104, the plates 118 of the columns 104 can be made to represent a floor, a table top, etc., depending on the height of the columns 104. As another example, in embodiments with the platform 102 comprising a plurality of horizontally orientated columns 104, the plates 118 of the columns 104 can be made to represent a doorjamb, a window frame, etc., depending on the lateral extension of the columns 104. As another example, in embodiments with the platform 102 comprising a plurality of columns 104 orientated at vertical, horizontal, or other angles, the plates 118 of the columns 104 can be made to represent a protrusion form a wall, an ornament extending from the wall or ceiling, a prop, a surface ornamentations of a prop, etc., depending on the extension of the columns 104. The plate 118 can be affixed to the second end 104b so as to be perpendicular to the longitudinal axis 116, or at any other orientation to the longitudinal axis 116. In some embodiments, the plate 118 can have dimensions that are the same as the cross-sectional dimensions of the column 104 to which it is attached.

Figure 6B:
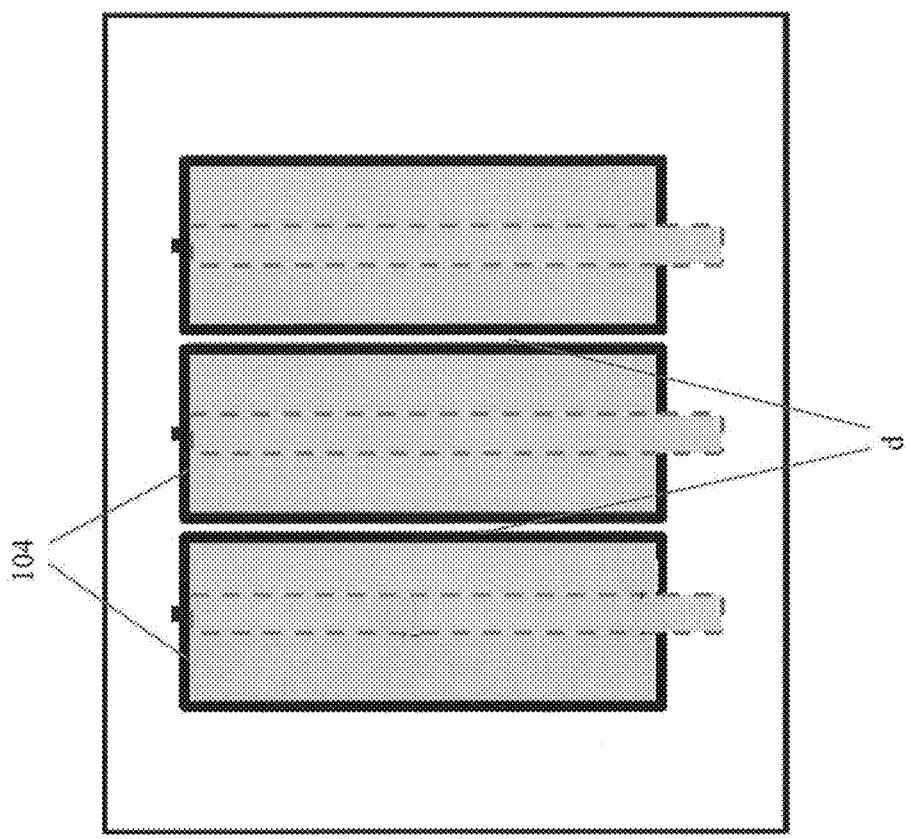
FIG. 6B shows a side view of an exemplary column arrangement that can be used with an embodiment of the platform.
Figure 6A:
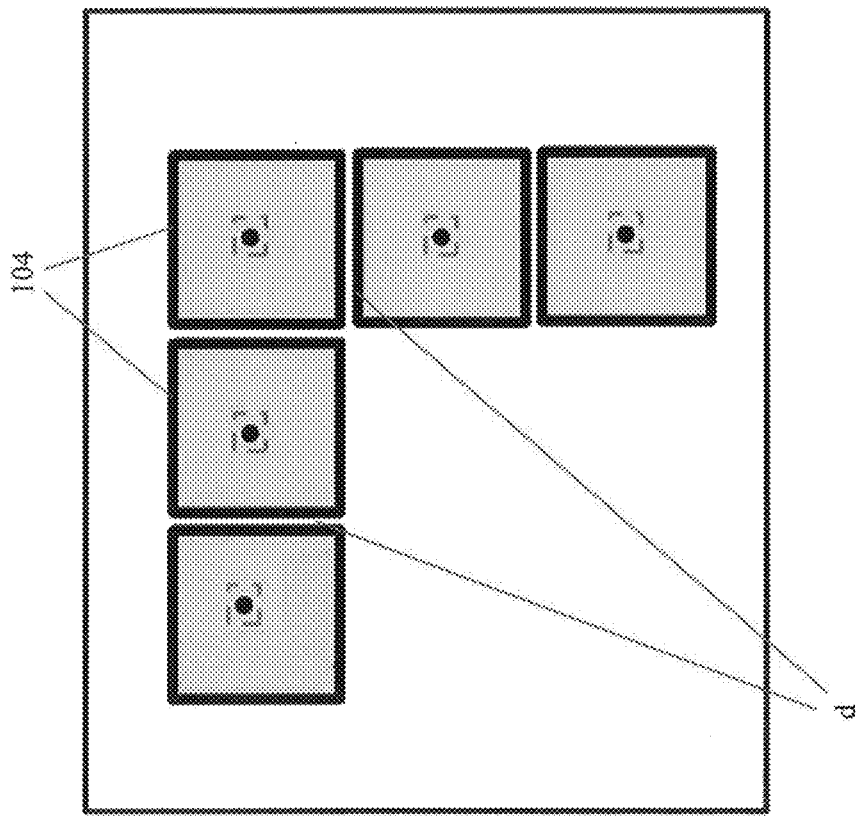
FIG. 6A shows a top view of an exemplary column arrangement that can be used with an embodiment of the platform.

Referring to FIGS. 6-7, in some embodiments, the plate 118 of a column 104 can have dimensions that allow the column 104 with which it is attached to be positioned adjacent a column 104 having a plate 118 attached to its second end 104b. For example, the array of columns 104 can have an array of plates 118, wherein each plate 118 of the array of plates 118 is adjacent another plate 118. A plate 118 of a column 104 can have the same or similar dimensions as that of the column 104 to which it is attached. Thus, the spacing or gap d between each column 104 can be the same as that of the spacing or gap d between each plate 118. The spacing or gap of d between each column 104 and/or each plate 118 can be made so as to allow for motion of the column 104 along the longitudinal axis 116 (e.g., extending and retracting of the column 104). The spacing or gap of d between each column 104 and/or each plate 118 can be made such that when the plate 118 of a first column 104 is aligned with the plate 118 of an adjacent second column 104 a surface is generated without gaps that would cause a user to trip over, fall through, create a visual aberration in the anticipated visual effect, etc. Being aligned can be defined as the second end 104b of the first column 104 being at the same location (e.g., first location 106, intermediate location 110, or second location 108) as the second end 104b of the second column 104. The spacing or gap of d between each adjacent plate 118 and/or column 104 can be made such that when a second end 104b of a first column 104 is extended to a location that is different from a location of its adjacent column's second end 104b, there is no gap that would allow a user to fall through, allow a user to be caught in a pinch point, create a visual aberration in the anticipated visual effect, etc. Thus, the spacing or gap d between each adjacent column 104 and/or plate 118 can be small enough to generate a structure that allows for movement (extending and retracting of the column 104), but also provides unimpeded access to an adjacent column 104 (e.g., gaps are small enough to generate a semi-contiguous structure), provides sufficient tactile support (e.g., no wide gaps between adjacent columns that would cause a loss of tactile feedback response when touching a structure made from a plurality of columns 104), and prevents pinching hazards (e.g., prevents appendages and body parts from being caught or pinched between adjacent plates 118 and/or columns 104), etc.

In some embodiments, the platform 102 can be configured such that the column first end 104a of each column 104 in the platform 102 and the actuators 112 of the platform 102 are attached to or erected on a surface 120 (see FIG. 3B). The surface 120 can be a load bearing floor (e.g., concrete floor), a wall, a ceiling, a support structure (of the topology or of another structure such as a cross-beam of a piece of furniture), or any other surface. As noted herein, the column 104 can be positioned to be in a vertical, horizontal, or any angle there-between orientation. This can be vertical, horizontal, or any angle there-between with respect to the ground, the wall, the ceiling, or other surface 120. For instance, with a vertical orientation, the longitudinal axis 116 is perpendicular to this surface 120. As noted herein, embodiments of the platform 102 can be configured to provide an operational space (the space in which the users operate) for users. This can include the plates 118 of the columns 104 providing a top surface to serve as a floor, table top, etc. For example, a platform 102 comprising an array of vertically, horizontally, or any angle there-between orientated columns 104 can be configured to support users and other props that may be used within the virtual environment formed by the platform 102. The props can be placed on and the users can walk on or touch the plates 118 supporting the end caps of the columns 104. For some embodiments, it is contemplated for a majority of the props to be positioned on and for the users to walk on the plates 118 of the columns 104 positioned at the first location 106 (e.g., these columns 104 being fully retracted to form the floor level of the virtual environment). Thus, when the floor level of the virtual environment is defined by columns 104 being fully retracted, the full load of users and props placed on them can be transferred to the surface 120. For example, when fully retracted, the columns 104 can transfer the load to the surface 120 because no member 114 of the column 104 would be held in an extended position by the actuator 112. This may be done to reduce wear on the actuators 112. However, the actuator 112 can be configured to support the loads of users and props when the column 104 is at an intermediate 110 or second location 108.

In some embodiments, the column 104 and/or plate 118 dimensions can be configured to allow for a side-by-side configuration of the columns 104 within the array of columns 104 (see FIG. 3A). For example, each column 104 within the array of columns 104 can be arranged side-by-side so that each column 104 is adjacent another column 104. With each column 104 being arranged in a vertical or horizontal orientation, the side-by-side configuration can provide lateral stabilization for the columns 104 in the array of columns 104. Thus, in the event a column 104 becomes loose or detached from the surface 120, the column 104 would not fall out of the array of columns 104. In addition, the loose column 104 may still be able to be actuated because it is being laterally supported by the other columns 104 adjacent to it. This can provide added safety and continuity of operability for the system 100.

The actuator 112 can be connected to the column 104 at or near the first end 104*a*. In some embodiments, the actuator 112 can be configured to occupy a space that is lower than the first location 106 of the column 104. Thus, the actuator 112 would lie at a position that is more proximal to the surface 120 than that of the second end 104*b* of the column 104. This can allow for various columns 104 of a multi-column platform 102 to be extended and retracted to form various environments while the actuators 112 are always hidden and out of the operational space of the platform 102.

As noted herein, the columns 104 and actuators 112 can be configured to support loads that are users and props. In some embodiments, any one of the actuators 112 can be configured to include a safety stop. The safety stop can be a mechanical stop configured to prevent movement of the column 104 and/or actuation of the actuator 112 when power to the actuator 112 is cut off. When the power to an actuator 112 is cut off, the safety stop can force the column 104 to remain at the location it was set before the power to the actuator 112 was cut off. This can prevent the column 104 from retracting if the power to the actuator 112 is inadvertently cut off. This can provide added safety and continuity of operability for the system 100.

Figure 8:
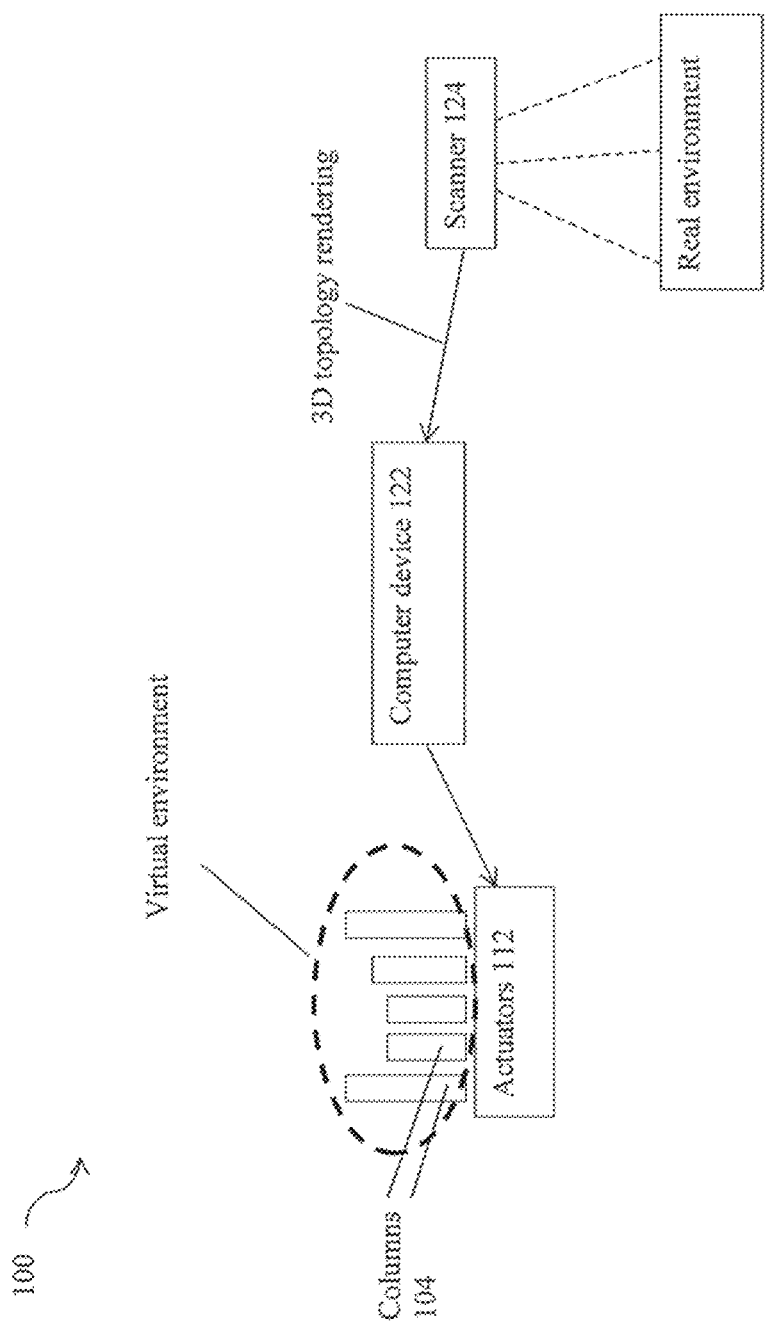
FIG. 8 shows an exemplary block diagram of component parts of an embodiment of the system.
Figure 9:
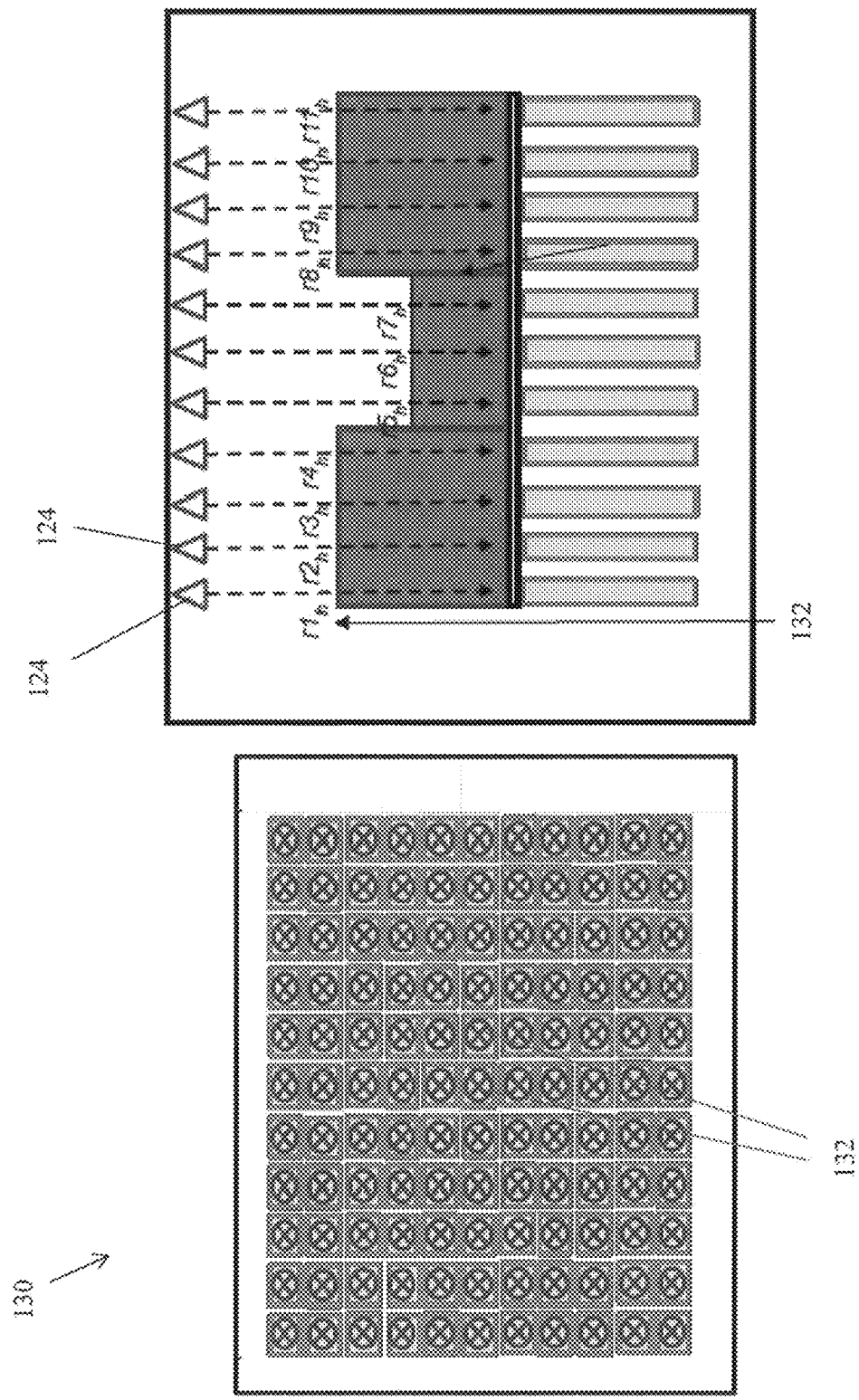
FIG. 9 shows an exemplary virtual grid (image on the left) and an exemplary 3D topology rendering process (image on the right) that can be used to generate an embodiment of a virtual environment.

Referring to FIGS. 8-9, in some embodiments, the system 100 can include a computer device 122 that can be in operative association with at least one actuator 112. This can include being in operative association with a processor of the actuator 112. While embodiments of the system 100 can allow for manual operation of the actuators 112, some embodiments can use the computer device 122 to control of each actuator 112, individually or in combination. For example, embodiments of the actuator 112 can include an encoder in operative association with the processor of the actuator 112, the encoder being configured to control the length and speed at which the column 104 to which the actuator 112 is associated is actuated. A user can enter instructions via the computer device 122 regarding the length and speed at which the column 104 is moved. These instructions can be converted into signals and transmitted to the processor of the actuator 112 via a hardwire or a wireless (e.g., via transceivers associated with the computer device 122 and the actuators 112) communication link. The instructions can be processed by the processor of the actuator 112 and transmitted to the encoder to cause the actuator 112 to actuate the column 104 in accordance with the instructions. The encoder can convert the instructions to a length and speed by which the column 104 is actuated. For example, the length can be converted to a location at which the second end 104*b* of the column 104 is to be actuated (e.g., extended or retracted).

While embodiments of the system 100 can be implemented without use of a 3D topology rendering, some embodiments can include generating a 3D topology rendering of a real environment. The 3D topology rendering can be obtained via a scanner 124. This can include a LASER scanner, a LIDAR scanner, a RADAR scanner, a SONAR scanner, etc. For example, the scanner 124 can be used to scan a real environment and generate a 3D topology of the real environment. The 3D topology rendering can be sent to the computer device 122 to be converted to a set of instructions. The set of instructions can be sent to the actuators 124. The instructions can be converted to a length and speed by the encoders in which each column 104 within the array of columns 104 can be actuated.

In some embodiments, the 3D topology rendering can be used to automatically generate a virtual environment of the real environment by causing the actuators 112 to extend or retract columns 104 within the array of columns 104 so as to replicate the 3D topology rendering of the real environment. For example, the 3D topology rendering can be mapped on to a virtual grid 130, the virtual grid 130 being representative of the platform 102. Each column 104 in the array of columns 104 can be a coordinate point 132 of the virtual grid 130. Coordinate points 132 of the 3D topology rendering can be co-registered with coordinate points 132 of the virtual grid 130. Thus, coordinates of changes in distance from a surface 120 level in the 3D topology rendering (e.g., a table, a countertop, etc.) can be co-registered with coordinates of the virtual grid 130 so that columns 104 corresponding to the co-registered coordinate points 132 that are to be representative of the change in height can be extended or retracted. As another example, coordinate points 132 of the 3D topology rendering that are at ground level can be co-registered with coordinates of the virtual grid 130 so that columns 104 corresponding to the co-registered coordinate points 132 can be moved to a position to form the floor for the virtual environment. The floor of the virtual environment can be representative of the ground level in the 3D topology rendering, and thus representative of the floor of the real environment. As another example, coordinate points 132 of the 3D topology rendering that are of a table can be co-registered with coordinates of the virtual grid 130 so that columns 104 corresponding to the co-registered coordinate points 132 can be moved to a position to form the table for the virtual environment. The table of the virtual environment can be representative of the table in the 3D topology rendering, and thus representative of the table of the real environment.

An extension to the above example can be made to generate and use coordinate points 132 of a virtual grid 130 for representation of surface points of any object (not just the floor or tables identified above) in reference to other surfaces (not just the floor identified above). For example, coordinate points 132 of the 3D topology rendering can be co-registered with coordinates of the virtual grid 130 so that columns 104 corresponding to the co-registered coordinate points 132 can be moved to a position to form a stair case, a window opening, surface ornamentations of a prop, a dynamic flow pattern (e.g., a wave motion, opening of doors, opening of a hole in the wall or ceiling, etc.), railings, rail posts, a table top with open areas under the table top, etc.

As a non-limiting example, a real environment can be a room with a floor, four walls, a table, and a couch. The real environment can include a window opening in a wall and a doorway in a wall. The real environment can include a stairway. The 3D topology rendering can be made of the real environment. Coordinate points 132 on the 3D topology can be co-registered with the coordinate points of the virtual grid 130 so that a virtual environment can be made in which columns 104 are positioned at various locations to represent the floor, walls, four walls, the table, the couch, and the stairs. For example, all of the columns 104 of the platform 102 can be fully retracted so as to allow the second ends 104b of each column 104 to be at the first location 106 and form a floor, with exception of some other columns 104 that will be extended to form the interior walls, the table, the couch, window and door openings, and the stairs. Columns 104 in predetermined rows of the array of columns 104 can be extended to be fully extended so as to allow the second ends 104b of those columns 104 to be located at the second location 108. This can allow each of these rows to form the interior walls. Columns 104 in predetermined rows of the array of columns 104 can be extended so as to allow the second ends 104b of those columns 104 to be located at a first intermediate location 110. This can allow the columns 104 of these rows to form the table. Columns 104 in predetermined rows of the array of columns 104 can be extended so as to allow the second ends 104b of those columns 104 to be located at a second intermediate location 110. This can allow the columns 104 of these rows to form the couch. Columns 104 in predetermined rows of the array of columns 104 can be extended to allow the second ends 104b of those columns 104 to be located at a plurality of third intermediate locations 110. The plurality of third intermediate locations 110 can be successive heights so as to form the stairs. At least some of the columns 104 in the row forming a wall can be extended to a fourth intermediate location 110. This can allow these columns 104 to form the bottom of the window opening. The columns 104 that are fully extended and that are adjacent the columns extended to the fourth intermediate location 110 can form the sides of the window opening. At least some of the columns 104 in the row forming a wall can be retracted so as to be fully retracted and allow the second ends 104b of each of these columns 104 to be at the first location 106, allowing these columns 104 to form a bottom of the doorway. The columns 104 that are fully extended within the wall and that are adjacent the columns 104 forming the bottom of the doorway can form the sides of the doorway.

As noted herein, the system 100 can be used to provide a dynamic virtual environment. This can include changing the virtual environment formed by the platform 102 while users operate in the virtual environment. For example, the location and/or size of objects represented by the columns 104 can be changed by re-configuring the columns 104, objects represented by the columns 104 can be removed by re-configuring the columns 104, and/or objects can be added by re-configuring the columns 104. This can be achieved by manual actuation of the actuators 112 or by a user inputting instructions via the computer device 122 to cause the actuator to actuate predetermined columns 104 to facilitate changing, removing, and/or adding objects.

As shown in FIG. 3B, some embodiments can include at least one sensor 126 (camera, position sensor, motion sensor, etc.). The sensor 126 can be used to record and track movement of users. The sensor 126 can be in operative association with the computer device 122. Users can control the operation of the cameras 126 via instructions inputted into the computer device 122 and transmitted to a processor of the sensor 126. The instructions can be transmitted via a hardwire or a wireless (e.g., via transceivers associated with the computer device 122 and the cameras 126) communication link. The sensor 126 can be located at a position that is above the platform 102. In some embodiments, the sensor 126 can be held in position above the platform 102 that is further than the second location 108. Thus, when any of the columns 104 of the platform 102 are fully extended, they do not make contact with the sensor 126 and/or interfere with the field of view for the sensor 126.

In some embodiments, the column 104 can include a sleeve shrouding at least a portion of the column 104. The plate 118 can include an end cap 119 covering at least a portion of the plate 118. In some embodiments, the sleeve and/or end cap 119 can be configured to be soft but resilient so as to provide a durable, yet soft surface. The soft surface may be desired for safety.

Figure 10:
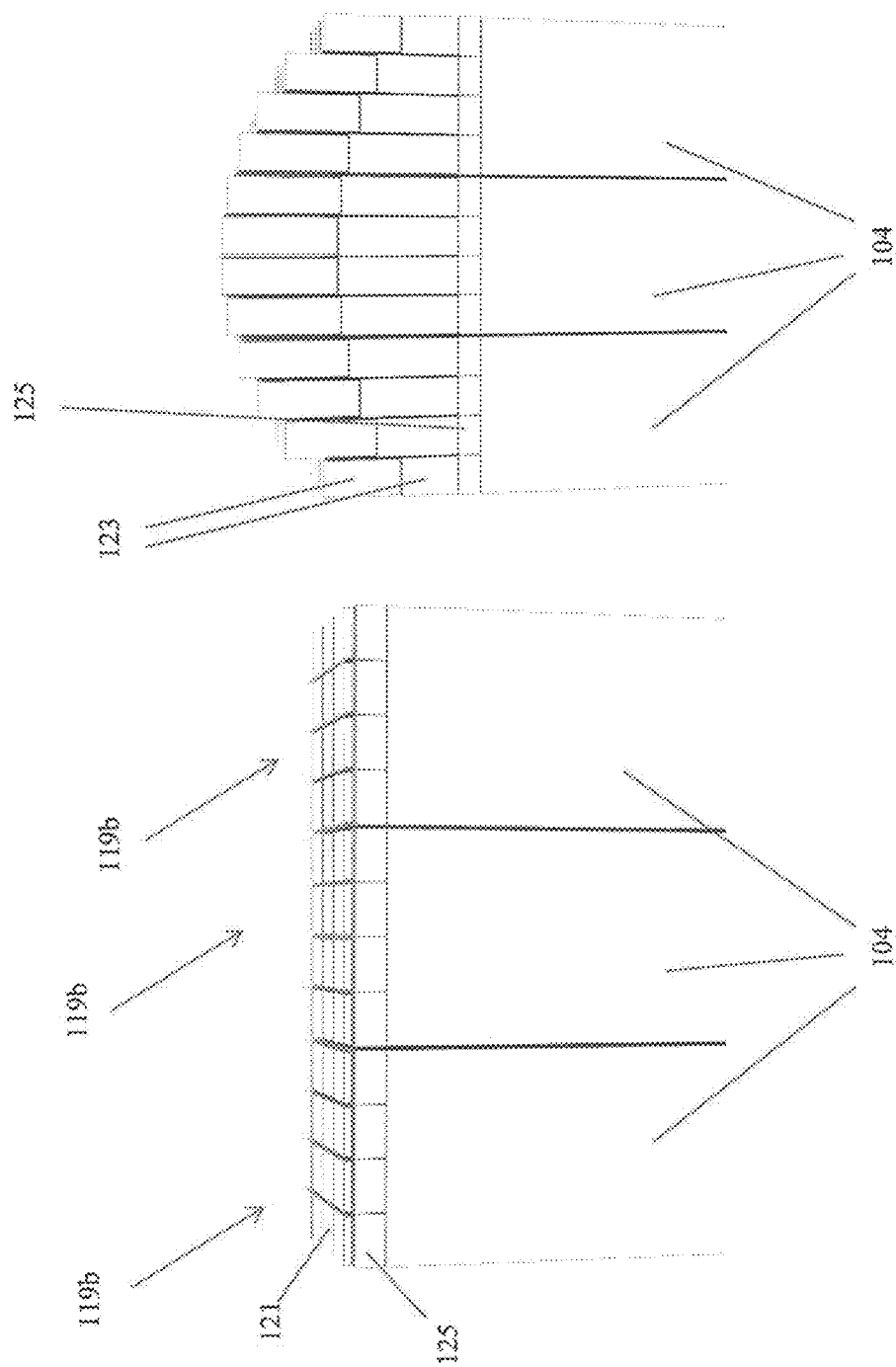
FIG. 10 shows an exemplary embodiment of a dynamic end cap configuration for the system.

Referring to FIG. 10, the end caps 119 can be a static type end cap 119a (see FIG. 7B) and/or a dynamic type end cap 119b. The static type end cap 119a is a cap that is configured as a cover for a portion of the plate 118. Static type end caps 119a can provide a particular shape affixed to the top of a column 104. The dynamic type end cap 119b is a cap that has at least one smaller column-actuator arrangement with an associated cap top 121 configured to allow extension and retraction of the cap top 121 to provide further topological customization and to include finer surface detail than that provided by its larger columns-actuator counterpart. While static style end caps 119a provide a predefined shape to the top columns 104, the dynamic end caps 119b are smaller versions of the column-actuator arrangements that provide customizable shape to the top of columns 104. Any of the static end caps 119a or dynamic end caps 119b can be of any shape or size.

For instance, a dynamic type end cap 119 can include at least one sub-column 123 (being a sub-member or plurality of engaged sub-members) located at or near the column second end 104b. The column second end 104b can be configured (e.g., be hollowed out) to allow for extension and retraction of the sub-column 123. The dynamic type end cap 119 can include at least one sub-actuator 125 in mechanical connection with the sub-column 123 to cause the sub-column to actuate (extend or retract). It is contemplated for the sub-columns 123 to have dimensions smaller than those of the columns 104 and movements that are more refined than those of the columns 104, and thus actuation of the sub-column 123 provides the ability to customize the topology and provide surface detail beyond what can be achieved via the columns 104.

An exemplary, non-limiting embodiment of the system 100 can include a platform 102 configured as a square array of vertically, horizontal, or any angle there-between arranged columns 104. Each column 104 can be positioned at a coordinate point 132 of a virtual grid 130. For example, the longitudinal axis 116 of each column 104 can be positioned at the coordinate point 132 of the virtual grid 130. Each column 104 can include a first member 114a, a second member 114b, a third member 114c, and a fourth member 114d. Use of four members 114 is exemplary, and it should be understood that any number of members 114 can be used. The second member 114b can be configured to engage the first member 114a. The third member 114c can be configured to engage the second member 114b. The fourth member 114*d* can be configured to engage the third member 114*c*. The first end 104*a* of each column 104 can be a distal end of the first member 114*a* that is attached to or erected on a surface 120. The second end 104*b* of each column 104 can be a distal end of the fourth member 114*d*. Each second end 104*b* can include a plate 118.

Each member 114 of each column 104 can have a square shape, but other shapes can be used. It is contemplated for the shape of the column 104 to be selected for supporting contemporary architecture shapes found in wall features of modern structures as well as supporting non-contemporary architecture shapes found in older and uncommon structures.

When the fourth member 114*d*, the third member 114*c*, and the second member 114*b* are fully retracted, the plate 118 of the column 104 can be at the first location 106. When the fourth member 114*d*, the third member 114*c*, and the second member 114*b* are fully extended, the plate 118 of the column 104 can be at the second location 108. When any of the fourth member 114*d*, the third member 114*c*, and the second member 114*b* is between being fully extended and fully retracted, the plate 118 of the column 104 can be at the intermediate location 110.

Each column 104 can be constructed of a plurality of metal members 114, each member 114 being shrouded by a sleeve. Each plate 118 can be constructed of a metal plate covered by an end cap.

The actuator 112 for each column 104 can be attached to or erected on the surface 120 and be placed into mechanical connection with the column 104 at or near the first end 104*a* of the column 104. The position of the actuator 112 can be more proximate to the surface than that of the first member 114*a*.

The system 100 can include a plurality of sensors 126 positioned above the platform 102. The system 100 can include a computer device 122. The computer device 122 can be in operative association with each actuator 112 and each sensor 126. The system can include a scanner 124. The scanner 124 can be in operative association with the computer device 122. The scanner 124 can be used to generate a 3D topology rendering of a real environment. The 3D topology rendering can be transmitted to the computer device 122. The computer device 122 can map coordinate points 132 of the 3D topology rendering to coordinate points 132 of the virtual grid 130. The computer device 122 can transform the 3D topology rendering into a set of instructions and transmit the instructions to the actuators 112. The actuators 112 can cause the columns 104 of the platform 102 to be extended or retracted to generate virtual objects and virtual features that represent real objects and real features of the real environment. This can include generating virtual floors, virtual ceilings, virtual walls, virtual tables, virtual stairways, virtual doorways, virtual window opening, etc. This can be done to generate a virtual environment that is a physical mock representation of the real environment in which users can operate. Other computer-generated scenario simulations can be used in conjunction with the physical mock representation to provide a hyper reality environment. For example, users can use virtual reality headsets, haptic feedback systems, etc. and define an avatar 128 within the 3D topology rendering that is synchronized with the virtual environment to augment the hyperreality environment.

In some embodiments, the system 100 can be utilized in furniture and configured to generate a topology that affords users with a highly customized support structure designed to accommodate varying body shapes, sizes, and individual comfort levels. For example, the support structure of the furniture (e.g., head rest, back portion of a chair, etc.) can be the surface 120 where the system 100 is attached. While the columns 104 (in the extended state or retracted state) are always contained within the upholstery of the furniture, the columns 104 or sub-columns 123 can be actuated to provide adjustable firmness, adjustable heights and positions, ergonomic or therapeutic effects, etc.

In some embodiments, the system 100 can be uses as a prop generator or surface generator for greenscreen film stage. For instance, the system 100 or a plurality of systems 100 can be used to generate various shapes, objects (e.g., walls, windows, doors, props, debris, etc.) or visual effects (moving objects, undulating surfaces, etc.) for greenscreen film productions and graphics.

It should be understood that modifications to the embodiments disclosed herein can be made to meet a particular set of design criteria. For instance, the number of or configuration of platforms 102, columns 104, actuators 112, computer devices 122, cameras 126, and/or other components or parameters may be used to meet a particular objective. As an example, the system 100 can include a plurality of platforms 102, each platform 102 having a plurality of columns, 104, actuators 112, etc. The plurality of platforms 102 can be used as a kit, allowing for scalability and modularity of the system 100, which can provide for quick and easy configuration and re-configuration of the topologies for any environment. Any of the columns 104 and actuators 112 of one platform 102 can be the same as or different from the columns 104 and actuators 112 of another platform 102. Any one or combination of platforms 102 (or component parts of a platform 102) can be used with another platform 102 (or component parts of that platform 102). This can be done to provide a great deal of versatility and customization for a user. The system 100 can be configurable and re-configurable to change the objects and features of the environment and represent different or dynamic environments rapidly and at any time.

In addition, the system 100 is easily transportable and deployable. For instance, the system 100 can be assembled and disassembled quickly and easily. Once disassembled, the component parts can be easily transported to a location for quick assembly.

It will be apparent to those skilled in the art that numerous modifications and variations of the described examples and embodiments are possible in light of the above teachings of the disclosure. The disclosed examples and embodiments are presented for purposes of illustration only. Other alternative embodiments may include some or all of the features of the various embodiments disclosed herein. Therefore, it is the intent to cover all such modifications and alternative embodiments as may come within the true scope of this invention, which is to be given the full breadth thereof. Additionally, the disclosure of a range of values is a disclosure of every numerical value within that range, including the end points.

Therefore, while certain exemplary embodiments of apparatuses and methods of making and using the same have been discussed and illustrated herein, it is to be distinctly understood that the invention is not limited thereto but may be otherwise variously embodied and practiced within the scope of the following claims.

We claim:

1. A scalable, modular system for generating one or more temporary structures of a room layout, the system comprising:

a platform comprising a plurality of columns configured in an array, each column comprising a first end and a second end;

a plurality of actuators, an actuator of the plurality of actuators in mechanical connection with a column, the actuator configured to cause the column to extend and retract so as to form at least a portion of one or more temporary structures;

a computer device configured to generate a virtual grid of the platform, wherein a position of each column in the array corresponds to a column coordinate point; and a scanner configured to generate a 3-dimensional (3-D) topology rendering of a real structure environment representative of the room layout, the 3-D topology rendering comprising real coordinate points of one or more structures of the real structure environment;

wherein the computer device maps the virtual grid to the real coordinate points of the 3-D topology rendering;

wherein the computer device causes the plurality of actuators to actuate in accordance with the mapped virtual grid to cause the plurality of columns to move until the column coordinate points co-register with the real coordinate points of the 3-D topology rendering so that the plurality of columns form the one or more temporary structures as a physical mock representation of the one or more structures of the real structure environment; and wherein the one or more temporary structures includes a floor, a wall, and an object that are physical mock representations of a floor, a wall, and an object of the real structure environment.

2. The system recited in claim 1, wherein the one or more temporary structures includes free-standing wall.

3. The system recited in claim 1, wherein the one or more temporary structures includes one or more of a prop, a window opening, or a door opening.

4. The system recited in claim 1, wherein the second ends of the columns of the platform are configured to provide a walking surface for users.

5. The system recited in claim 4, wherein the one or more temporary structures includes a staircase.

6. The system recited in claim 1, wherein the scanner is any one or combination of a LASER scanner, a LIDAR scanner, a RADAR scanner, or a SONAR scanner.

7. The system recited in claim 1, wherein a second end of a column includes:
a static cap; or
a dynamic cap.

8. The system recited in claim 1, wherein at least one actuator comprises a safety stop configured to prevent movement of the column.

9. The system recited in claim 1, further comprising at least one sensor.

10. A method of generating one or more temporary structures of a room layout, the method comprising:
generating a platform comprising a plurality of columns configured in an array;
generating a virtual grid of the platform, wherein a position of each column in the array corresponds to a column coordinate point;
generating a 3-dimensional (3-D) topology rendering of a real structure environment representative of the room layout, the 3-D topology rendering comprising real coordinate points of one or more structures of the real structure environment;
mapping the virtual grid to the real coordinate points of the 3-D topology rendering;

causing the plurality of columns to move in accordance with the mapped virtual grid to cause the plurality of columns to move until the column coordinate points co-register with the real coordinate points of the 3-D topology rendering so that the plurality of columns form the one or more temporary structures as a physical mock representation of the one or more structure of the real structure environment;

wherein the one or more temporary structures includes a floor, a wall, and an object that are physical mock representations of a floor, a wall, and an object of the real structure environment.

11. The system recited in claim 1, wherein the plurality of columns comprises an array of vertically, horizontal, or any angle there-between orientated columns arranged in a side-by-side configuration.

12. The method recited in claim 10, wherein the one or more temporary structures includes a free-standing walls.

13. The method recited in claim 10, wherein the one or more temporary structures includes one or more of a prop, a window opening, or a door opening.

14. The method recited in claim 10, further wherein one or more temporary structures includes a staircase.

15. The method recited in claim 10, further comprising:
adjusting a length of any one or combination of the columns while users are within or on the one or more temporary structure.

16. The method recited in claim 10, wherein:
the array includes vertically, horizontal, or any angle there-between orientated columns arranged in a side-by-side configuration.

17. A scalable, modular system for generating a one or more temporary structures, the system comprising:
a platform comprising a plurality of columns configured in an array, the plurality of columns comprising a number of individual columns, each individual column comprising a first end and a second end;

a plurality of actuators comprising a number of individual actuators matching the number of individual columns, each individual actuator in mechanical connection with an individual column, wherein each individual actuator is configured to cause the individual column in mechanical connection therewith to extend and retract so as to form at least a portion of one or more temporary structures;

a scanner configured to generate a 3-dimensional (3-D) topology rendering of a real structure environment representative of the room layout, the 3-D topology rendering comprising real coordinate points of one or more structures of the real structure environment, each individual real coordinate point including a vertical component and a horizontal component corresponding to a surface point of the one or more structures;

a computer device configured to generate a virtual grid of the platform and assign a plurality of column coordinate points on the virtual grid, each column coordinate point corresponding to a physical position of a column second end in the array, wherein the computer device is configured to:
map the column coordinate points of the virtual grid to the real coordinate points of the 3-D topology rendering;
actuate at least one actuator of the plurality of actuators to extend or retract one or more column of the plurality of columns so that each individual column coordinate point has a vertical component that co-registers with the vertical component of a real coordinate point such that the plurality of columns form the one or more temporary structures as a physical mock representation of the one or more structures of the real structure environment; and actuate in accordance with the mapped virtual grid to cause the plurality of columns to form a floor, a wall, and an object that are physical mock representations of a floor, a wall, and an object of the real structure environment.

18. The system of claim 17, wherein each column comprises a plurality of telescopingly engaging members.

19. The system of claim 17, wherein the array of columns comprises a plurality of rows of columns.

20. The system recited in claim 17, wherein the scanner is any one or combination of a LASER scanner, a LIDAR scanner, a RADAR scanner, or a SONAR scanner.

* * * * *